US012628550B2

(12) United States Patent
Briscoe et al.

(10) Patent No.: US 12,628,550 B2
(45) Date of Patent: May 12, 2026

(54) SOLVENT ANNEALING

(71) Applicant: Queen Mary University of London, London (GB)

(72) Inventors: Joseph Briscoe, London (GB); Sinclair Ryley Ratnasingham, London (GB)

(73) Assignee: Queen Mary University of London, London (GB)

( * ) Notice: Subject to any disclaimer, the term of this patent is extended or adjusted under 35 U.S.C. 154(b) by 423 days.

(21) Appl. No.: 18/005,920

(22) PCT Filed: Jul. 19, 2021

(86) PCT No.: PCT/GB2021/051847
§ 371 (c)(1),
(2) Date: Jan. 18, 2023

(87) PCT Pub. No.: WO2022/018418
PCT Pub. Date: Jan. 27, 2022

(65) Prior Publication Data

US 2023/0301163 A1 Sep. 21, 2023

(30) Foreign Application Priority Data

Jul. 20, 2020 (GB) ..................................... 2011196

(51) Int. Cl.
*H10K 85/50* (2023.01)
*H10K 30/50* (2023.01)
(Continued)

(52) U.S. Cl.
CPC ............. *H10K 85/50* (2023.02); *H10K 71/15* (2023.02); *H10K 71/441* (2023.02); *H10K 30/50* (2023.02)

(58) Field of Classification Search
CPC ............................ H10K 85/50; H10K 71/441
See application file for complete search history.

(56) References Cited

U.S. PATENT DOCUMENTS

| | | | |
|---|---|---|---|
| 2009/0293675 | A1 | 12/2009 | Mukherjee et al. |
| 2018/0261394 | A1 | 9/2018 | Bag et al. |

FOREIGN PATENT DOCUMENTS

| | | |
|---|---|---|
| CN | 102534546 | 7/2012 |
| CN | 105793212 | 7/2016 |

(Continued)

OTHER PUBLICATIONS

Su J, Cai H, Ye X, Zhou X, Yang J, Wang D, Ni J, Li J, Zhang J. Efficient Perovskite Solar Cells Prepared by Hot Air Blowing to Ultrasonic Spraying in Ambient Air. ACS Appl Mater Interfaces. Mar. 20, 2019;11(11):10689-10696. doi: 10.1021/acsami.9b01843. Epub Mar. 6, 2019. PMID: 30799609. (Year: 2019).*

(Continued)

*Primary Examiner* — Matthew L Reames
(74) *Attorney, Agent, or Firm* — Smith Gambrell & Russell LLP

(57) ABSTRACT

A post-deposition treatment universally applicable to a wide range of perovskite solar cell configurations and architectures. The methodology yields significant improvements in device efficiency and lifetime coupled with a reduction in inherent batch-to-batch variability in all performance metrics. Such improvements are achieved following an aerosol-induced recrystallisation of solution-deposited $MAPbI_3$ thin films that result in a significant enlargement and improved homogeneity of grain size. The aerosol treatment is demonstrated as being suitable for a range of active layer thicknesses, interlayer choices, architectures and device active areas.

21 Claims, 16 Drawing Sheets

(51) Int. Cl.
*H10K 71/15* (2023.01)
*H10K 71/40* (2023.01)

(56) References Cited

FOREIGN PATENT DOCUMENTS

| | | | |
|---|---|---|---|
| CN | 105870341 | * | 8/2016 |
| CN | 111244291 | | 6/2020 |
| JP | 2018148070 | * | 9/2018 |

OTHER PUBLICATIONS

Bartholazzi et al. Influence of substrate temperature on the chemical, microstructural and optical properties of spray deposited CH3NH3PbI3 perovskite thin films, Journal of Materials Research and Technology, vol. 9, Issue 3, 2020, pp. 3411-3417, https://doi.org/10.1016/j.jmrt.2020.01.078 (Year: 2020).*
Min, J. et al., "Gaining Further Insight into the Effects of Thermal Annealing and Solvent Vapor Annealing on Time Morphological Development and Degradation in Small Molecule Solar Cells", Journal of Materials Chemistry A (2017), 12 pages.
Dickey, K.C., et al., "Improving Organic Thin-Film Transistor Performance through Solvent-Vapor Annealing of Solution-Processable Triethylsilylethynyl Anthradithiophene," Advanced Materials 18, 1721-1726 (2006).
Xiao, Z., et al., "Solvent Annealing of Perovskite-Induced Crystal Growth for Photovoltaic-Device Efficiency Enhancement", Advanced Materials 26, 6503-6509 (2014).
Tian, L., et al., "Post-Treatment of Perovskite Films Toward Efficient Solar Cells via Mixed Solvent Annealing", ACS Applied Energy Materials 2, 4954-4963 (2019).
Liu, J., et al., "Improved Crystallization of Perovskite Films by Optimized Solvent Annealing for High Efficiency Solar Cell", ACS Applied Materials & Interfaces 7, 24008-24015 (2015).
Xiong, H., et al., "Solvent Vapor Annealing of Oriented PbI 2 films for Improved Crystallization of Perovskite Films in the Air", Solar Energy Materials and Solar Cells 166, 167-175 (2017).
Zhang, F. et al., "Film-Through Large Perovskite Grains Formation: Via a Combination of Sequential Thermal and Solvent Treatment", Journal of Materials Chemistry A 4, 8554-8561 (2016).
Leolukman, M. et al., "Morphology Development in Asymmetric Poly (styrene-b-tert-butylacrylate) Thin Films by Solvent Annealing", Polymer Journal 40, 825-831 (2008).
Engmann, S., et al., "Film Morphology Evolution During Solvent Vapor Annealing of Highly Efficient Small Molecule Donor/Acceptor Blends", Journal of Materials Chemistry A 4, 15511-15521 (2016).
Du, T., et al., "Formulation, Location and Beneficial Role of PbI 2 in Lead Halide Perovskite Solar Cells", Sustain Energy Fuels 1, 119-126 (2017).
Chen et al., "A Simple, Low-Cost CVD Route to High-Quality CH 3 NH 3 PbI 3 Perovskite Thin Films", Crystengcomm, vol. 17, pp. 7486-7489 (2015).
Motilal et al., "Vapor Phase Conversion of PbI 2 to CH 3 NH 3 PbI 3: Spectroscopic Evidence for Formation of an Intermediate Phase", Journals of Materials Chemistry A, vol. 4, pp. 2630-2642 (2016).
Xiaobing et al., "A Review of the Role of Solvents in Formation of High-Quality Solution-Processed Perovskite Films", ACS Applied Materials & Interfaces, vol. 11, pp. 7639-7654 (2019).
Gao Li-Li et al., "Boundary Layer Tuning Induces Fast and High Performance Perovskite Film Precipitation by Facile One-Step Solution Engineering", Journal of Materials Chemistry, vol. 5, pp. 18120-18127 (2017).
Moorthy Boopathi et al., "Preparation of Metal Halide Perovskite Solar Cells Through a Liquid Droplet Assisted Method", Journal of Materials Chemistry, vol. 3, pp. 9257-9263 (2015).
Kyu-Jin et al., "Enhancement of Active Layer Characteristics with Solvent Spray Annealing Treatment for Organic Solar Cell", Japanese Journal of Applied Physics, vol. 51, p. 088003 (2012).
Jiang Yang, et al., "Negligible-Pb-Waste and Upscalable Perovskite Deposition Technology for High-Operational-Stability Perovskite Solar Modules", Advanced Energy Materials, vol. 9, p. 1803047 (2019).
Leyden et al., "Large Formamidium Lead Trihalide Perovskite Solar Cells Using Chemical Vapor Deposition with High Reproducibility and Tunable Chlorine Concentrations", Journal of Materials Chemistry A, vol. 3, pp. 16097-16103 (2015).
Huang-Haibo et al., "Two-Step Ultrasonic Spray Deposition of CH 3 NH 3 PbI 3 for Efficient and Large-Area Perovskite Solar Cell", Nano Energy, vol. 27, pp. 352-358 (2016).
The International Search Report released on Oct. 11, 2021 for corresponding International Application No. PCT/GB2021/051847; 4 pages.
First Notification of Office Action released by the Chinese Patent Office on Feb. 12, 2026 in corresponding Chinese Patent Application No. 202180059305.8; 9 pages.

* cited by examiner 0.5 l/min 0.1 l/min 0.1 l/min (Avg. Grain: 230nm)

0.5 l/min (Avg. Grain: 380nm)

1 l/min (Avg. Grain: 330nm)

5 min (Avg. Grain: 230nm)

20 min (Avg. Grain: 400nm)

SOLVENT ANNEALING

FIELD

The present invention relates to methods of treatment of material layers, in particular solvent annealing of perovskite layers.

BACKGROUND

Organic-inorganic metal halide perovskite materials have had significant impact across a variety of emerging opto-electronic platforms, extending beyond their initial use in photovoltaics (PVs), to create disruption in the light emitting diode (LED), photodetector (PD) and thin film transistor (TFT) research fields. Within the PV field the progress of perovskite solar cell (PSC) development has been underpinned by simultaneous advances in thin-film deposition, compositional modification, changes to the charge selective interlayers, interface modification and the incorporation of a wide variety of additives. Many of these strategies depend on the precise control of interlayer thickness as well as additive and dopant concentration. Typically, these values are already incredibly low, thus inadvertently these strategies for improvement may place significant constraints on future high-volume manufacturing.

Grain boundaries (GBs), whilst unavoidable in solution deposited PSCs, are unwanted microstructural features. They tend to host crystallographic defects e.g. vacancies, interstitials, anti-sites, all of which create intra-bandgap states that act as electronic traps. GBs are also reported to have several other drawbacks: i) fast channels for ionic transport thus contribute significantly to device hysteresis, ii) pathways for oxygen ingress and iii) susceptible areas for the formation of impurity phases [Ref. 10]. In particular, GBs parallel to the substrate present additional barriers to charge extraction in PSC, due to the out of plane charge transport. To circumvent these issues, efforts have been made to passivate GBs through additive engineering, directing crystal growth, promoting larger grains and fabricating PSCs from single crystals.

One means of reducing the number of GBs has been through solvent vapour annealing (SVA), a concept taken from the organic semiconductor community [Ref 1, Ref 2]. SVA has been an effective post-deposition treatment for PSCs, improving film crystallinity whilst not relying on complex compositional modifications to precursor solutions or as-deposited films [Refs 3 to 7]. SVA involves the introduction of solvent vapour during the crystallisation process of thin films, which lowers the diffusive energy barrier and allows for the coalescence of grains. In practice, the process is typically achieved by overturning a petri dish, or similar vessel, over a solvent rich thin film or a small reservoir of solvent. This traps the solvent vapour near the vicinity of the film. Typically, solvent exposure time and temperature are the critical variables, as there is a balance between grain growth and diminishing surface homogeneity [Ref 8]. Different solvents can also have different effects [Ref. 9].

SUMMARY

A technique to improve performance of devices including perovskite material layers is desirable.

According to the invention there is provided a method of solvent annealing comprising exposing a perovskite layer to a laminar flow of a solvent aerosol.

The method may further comprise heating the perovskite layer to a predetermined temperature (desirably in the range of from 50° C. to 200° C). during the exposing.

The exposing may be performed for a period greater than 2 minutes, preferably greater than 4 minutes.

The exposing may be performed for a period less than 10 minutes, preferably less than 7 minutes.

Desirably the solvent is a polar solvent.

More desirably the solvent is selected from the group consisting of:

N,N-Dimethylformamide
Water
Methanol
Ethanol
Isopropanol
2-Methoxyethanol
Acetone
Acetonitrile
Ethyl acetate
Chlorobenzene
Dimethyl sulfoxide Desirably the perovskite layer is formed of a perovskite material with the formula $A^1{}_pA^2{}_qA^3{}_rB(X^1{}_sX^2{}_tX^3{}_u)_3$, in which:

$A^1$, $A^2$ and $A^3$ are each independently caesium, rubidium, a $C_{1-5}$alkylamine cation, a $C_{1-5}$alkyldiamine cation or a guanidinium cation;

p q and r are each independently 0 to 1, with the proviso that p+q+r=1;

B is Pb or Sn;

$X^1$, $X^2$ and $X^3$ are each independently a halide or a pseudohalide; and s t and u are each independently 0 to 1, with the proviso that s+t+u=1.

More desirably the perovskite layer is formed of a material selected from the group consisting of:

$CH_3NH_3PbI_3$
$Cs_{0.15}(HC(NH_2)_2)_{0.85}Pb(I_{0.95}Br_{0.05})_3$
$CH_3NH_3PbI_{0.82}Br_{0.12}$
$Cs_{0.15}(HC(NH_2)_2)_{0.85}Pb(I_{0.9}Br_{0.1})_3$
$Cs_{0.1}(HC(NH_2)_2)_{0.9}Pb(I_{0.95}Br_{0.05})_3$ or is selected from the group consisting of $CH_3NH_3PbI_3$
$Cs_{0.15}(HC(NH_2)_2)_{0.85}Pb(I_{0.95}Br_{0.05})_3$
$CH_3NH_3PbI_{0.82}Br_{0.12}$
$Cs_{0.15}(HC(NH_2)_2)_{0.85}Pb(I_{0.9}Br_{0.1})_3$
$Cs_{0.1}(HC(NH_2)_2)_{0.9}Pb(I_{0.95}Br_{0.05})_3$
$HC(NH_2)_2PbI_3$
$FAPbI_3$ (e.g. α-phase $FAPbI_3$)
$FAPb(I_{3-x}Br_x)$ (e.g. α-phase $FAPb(I_{3-x}Br_x)$) in which x is greater than zero and less than three Desirably wherein the solvent is aerosolised in a carrier gas, e.g. $N_2$.

Desirably the flow rate of the carrier gas is in the range of 0.1 l/min to 1.5 l/min during the exposing.

Desirably the aerosol further comprises one or more additional components to dope the perovskite.

Desirably the aerosol further comprises one or more additives to alter a property of the perovskite layer, for example, interlayer/passivation additives.

Desirably the aerosol further comprises components to form organic charge transport and/or contact layers.

The method desirably further comprises incorporating the perovskite layer into a device such as a photovoltaic cell, a light emitting diode, a photodetector or a detector of ionising radiation.

Therefore, the present invention can provide a novel aerosol treatment technique to considerably improve the crystallinity of perovskite thin films. Improvements can include one or more of: an enhanced grain size, thereby reducing the GB concentration; a reduction in localised defects; and improvements in electronic and optoelectronic properties. The resulting PSCs may exhibit considerably improved PCEs and enhanced stabilities. Importantly, the present invention shows much greater reproducibility and uniformity when compared with SVA analogues. The present invention is versatile and, for example, can be performed on PSCs with perovskite active layer thicknesses ranging from 500-1300 nm, on large-area (>1 $cm^{-2}$) devices, and in a variety of device architectures and perovskite compositions.

BRIEF DESCRIPTION OF THE DRAWINGS

The invention will be described further below with reference to exemplary embodiments and the accompanying drawings, in which.

In the various drawings, like parts are indicated by like references.

EXEMPLARY EMBODIMENTS

The present inventors have determined that problems experienced in prior art SVA techniques have resulted from uncontrolled vapour flow and vapour-film interactions, resulting in localised areas with either insufficient solvent exposure thus no improvement on crystallinity, or excessive solvent exposure that leads to film coarsening. These drawbacks lead to issues with batch-to-batch reproducibility of the performance enhancement and uniformity issues across larger substrates. Thus, while SVA has shown promise for post-deposition improvements in perovskite films, alternative approaches are required to achieve the full potential of solvent-based post-treatment techniques.

Figure 1:
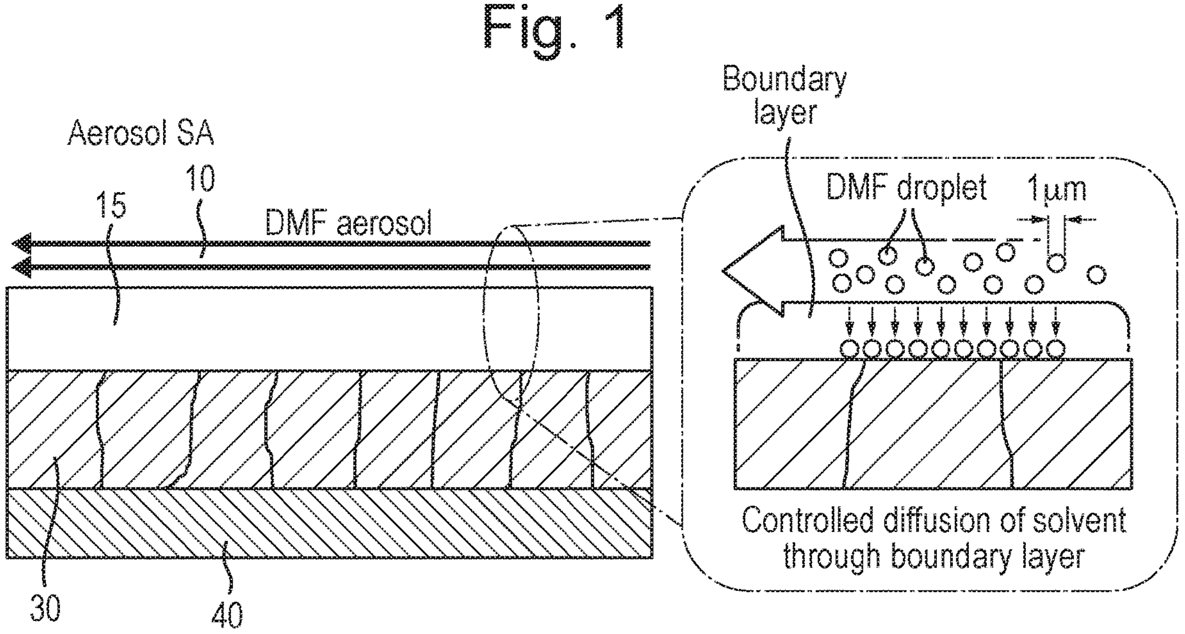
FIGS. 1 and 2 are schematic diagrams of a reaction process and a reactor used in a method of the invention.

In FIG. 1 a schematic drawing of the aerosol treatment of perovskite films (e.g. films of $CH_3NH_3PbI_3$ ($MAPbI_3$)) is shown. First a piezoelectric mister is used to aerosolise a solvent (e.g. N,N-Dimethylformamide (DMF)). This aerosol 10 is then carried into the reactor using a carrier gas (e.g. nitrogen), where it flows over the surface of the perovskite films 30 that are heated to a temperature in the range of from 50 to 200° C., desirably 80 to 120° C., e.g. about 100° C. The perovskite films may be formed on a substrate 40 which rests on a hot plate 50, e.g. a heated graphite block. The DMF then interacts with the perovskite films through boundary layer 15 and induces a recrystallisation process leading to grain growth within the film.

Figure 2:
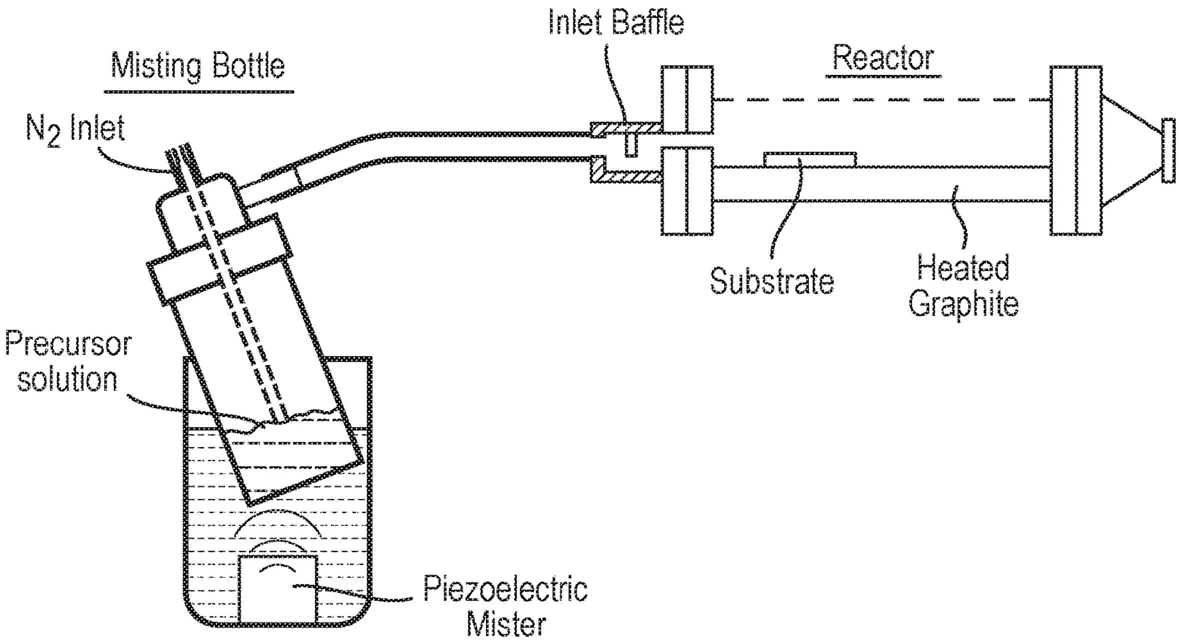

As shown in FIG. 2, for small batch processing the aerosol can be generated by a misting bottle including a piezoelectric mister that agitates a precursor solution in a bottle fed with a carrier gas. An inlet baffle in the reactor can be used to ensure laminar flow.

Figure 3:
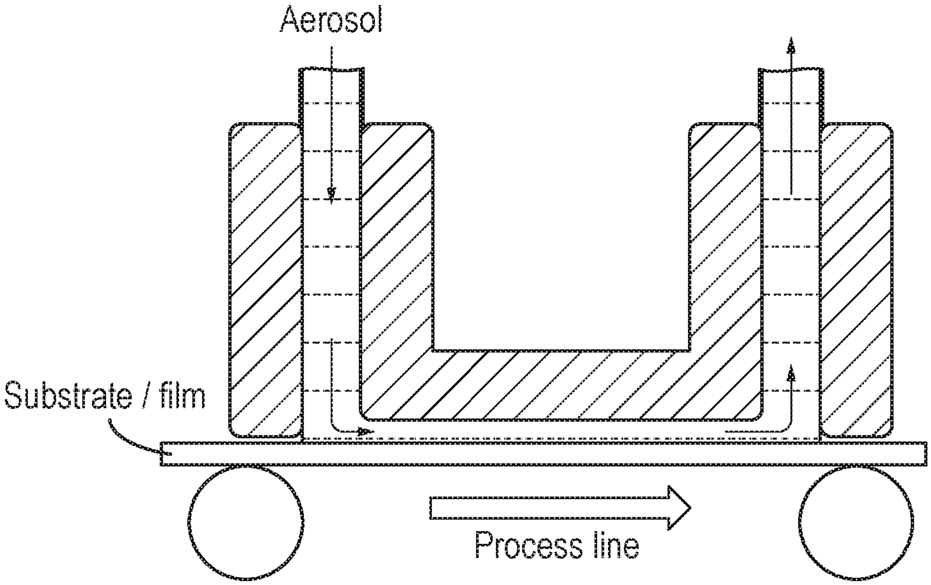
FIG. 3 is a diagram of the method of an embodiment employed in continuous film processing.

The present invention can also be used with continuous in-line processing methods. The aerosol can be arranged to form a laminar flow in parallel with the movement of a continuous film, as illustrated in FIG. 3.

Figure 4:
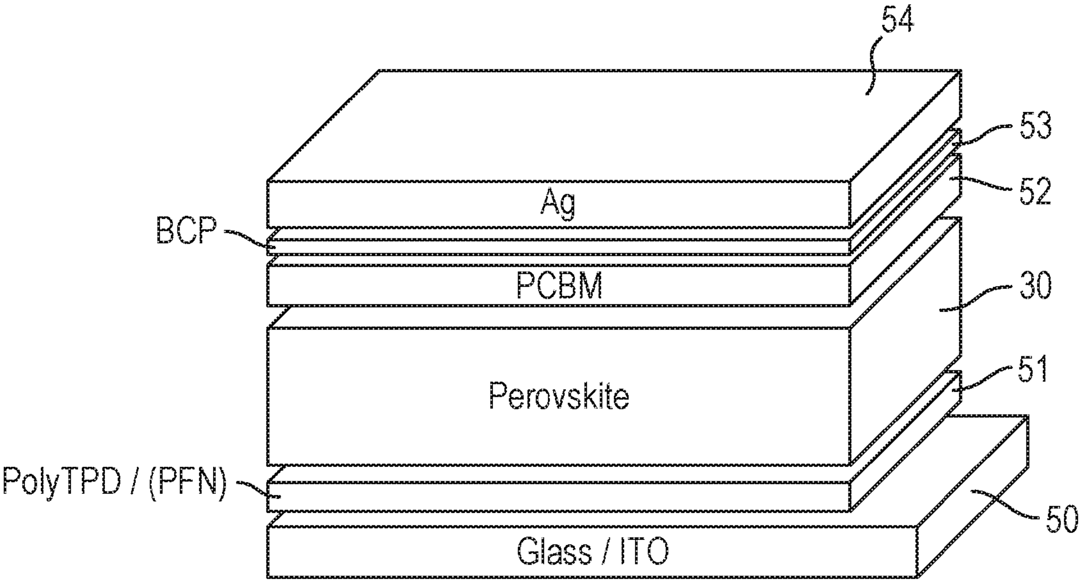
FIG. 4 is a schematic diagram of a p-i-n perovskite solar cell.

FIG. 4 shows a schematic drawing of a p-i-n device stack in which perovskite films treated by the invention can be used to advantage. Substrate 50 is made of a transparent material, e.g. glass, and has a transparent conductive layer, e.g. of Indium Tin Oxide (ITO), to form a lower electrode acting as an anode. A hole transport layer 51, e.g. of Poly(N,N'-bis-4-butylphenyl-N,N'-bisphenyl)benzidine (PolyTPD), poly(3,4-ethylenedioxythiophene) polystyrene sulfonate (PEDOT:PSS) or poly(triaryl amine) (PTAA), is formed on the lower electrode. Above the hole transport layer is the perovskite layer 30. Above the perovskite layer 30 is an electron accepting layer 52, e.g. formed of [6,6]-Phenyl-C61-butyric acid methyl ester (PCBM). An interfacial modification layer 53, e.g. formed of Bathocuproine (BCP) is formed on the electron accepting layer 52. The uppermost layer is an electrode, e.g. formed of Al, Cu, Ag or Au, acting as a cathode.

Figure 5:
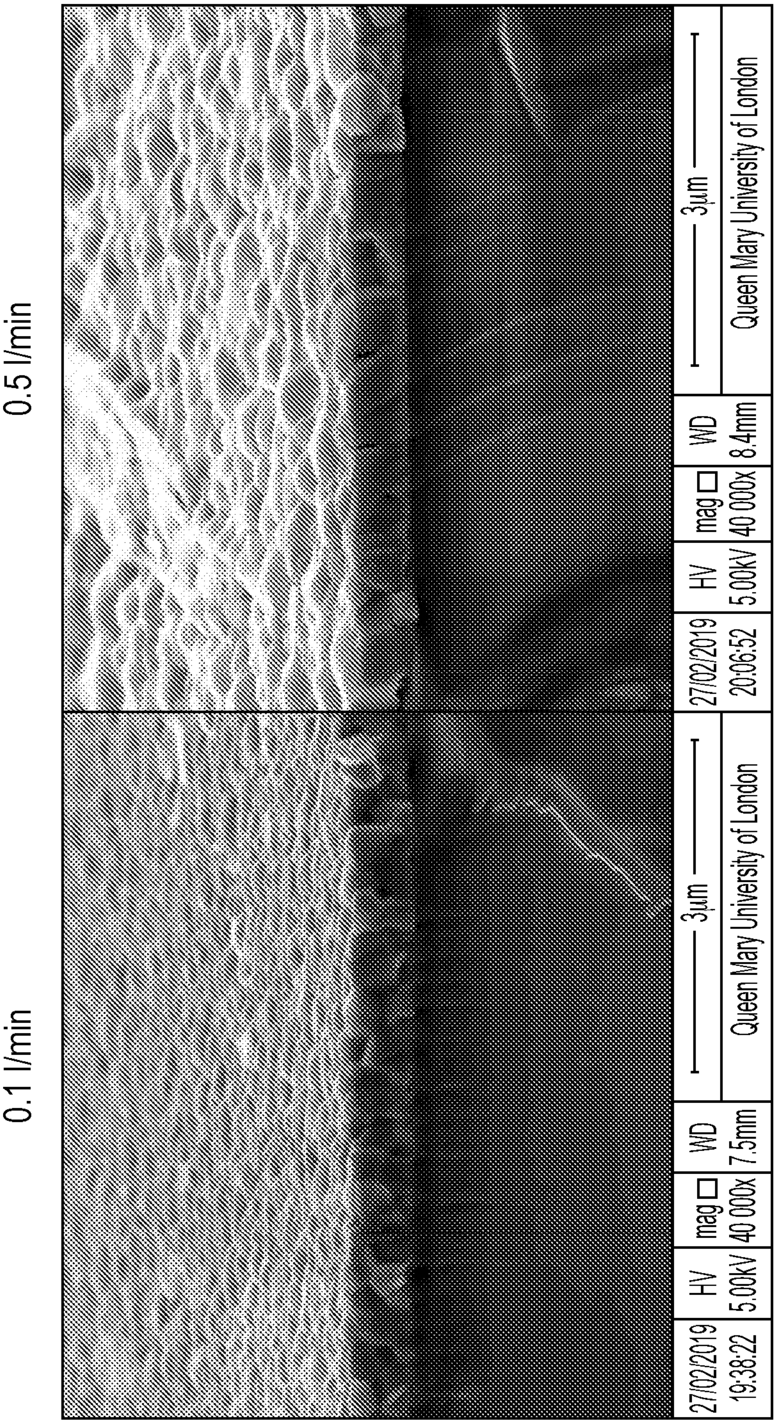
FIG. 5 comprises SEM images depicting cross-sections of perovskite films treated by methods according to the invention at different flow rates.

FIG. 5 comprises SEM images depicting cross-sections of perovskite films treated by methods according to the invention. It can be seen that the invention promotes growth of single grains extending in the thickness direction of the film through the full thickness. It is believed that this promotes charge transport across the film.

The final morphology of perovskite film can be readily tuned by controlling aerosol treatment parameters, such as flow rate and treatment time. The average grain size of the $CH_3NH_3PbI_3$ ($MAPbI_3$) film increases linearly with aerosol treatment time. Desirably the treatment time is greater than 1 minute, more desirably greater than 3 minutes. However, larger grains also result in a higher surface roughness. This is detrimental to the performance of planar-structured PSCs as it does not allow for the conformal coating of the ETL layer. Desirably the treatment time is less than 10 minutes, more desirably less than 7 minutes.

Figure 6:
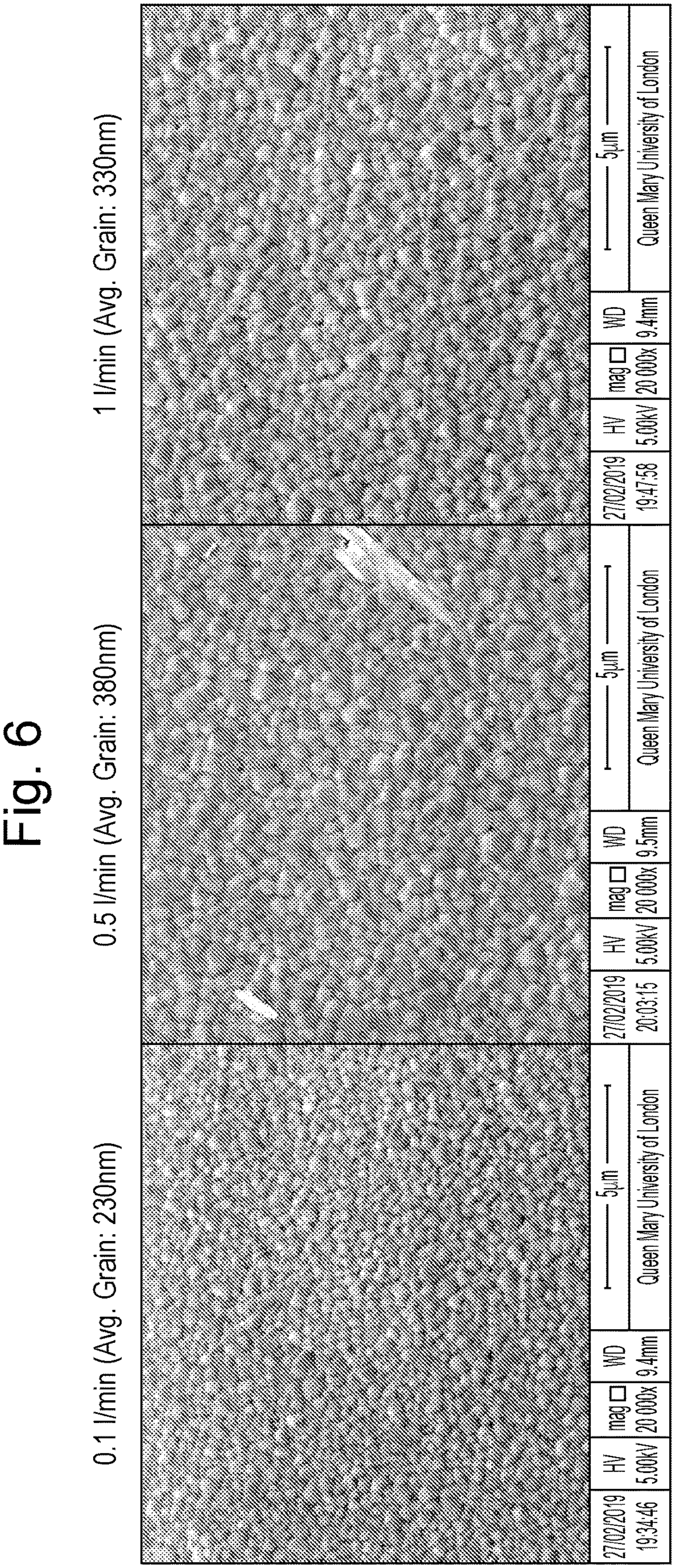
FIG. 6 comprises SEM images illustrating the effects of different flow rates on grain size.

Flow rates of the carrier gas in the range of from 0.1 L/min to 1 L/m are suitable. FIG. 6 comprises SEM images illustrating the effects of different flow rates on grain size. 0.1 l/min gave an average grain size of 230 nm, 0.5 l/min an average grain size of 380 nm and 1.0 l/min gave an average grain size of 330 nm. In many situations a larger grain size is more desirable.

Figure 7:
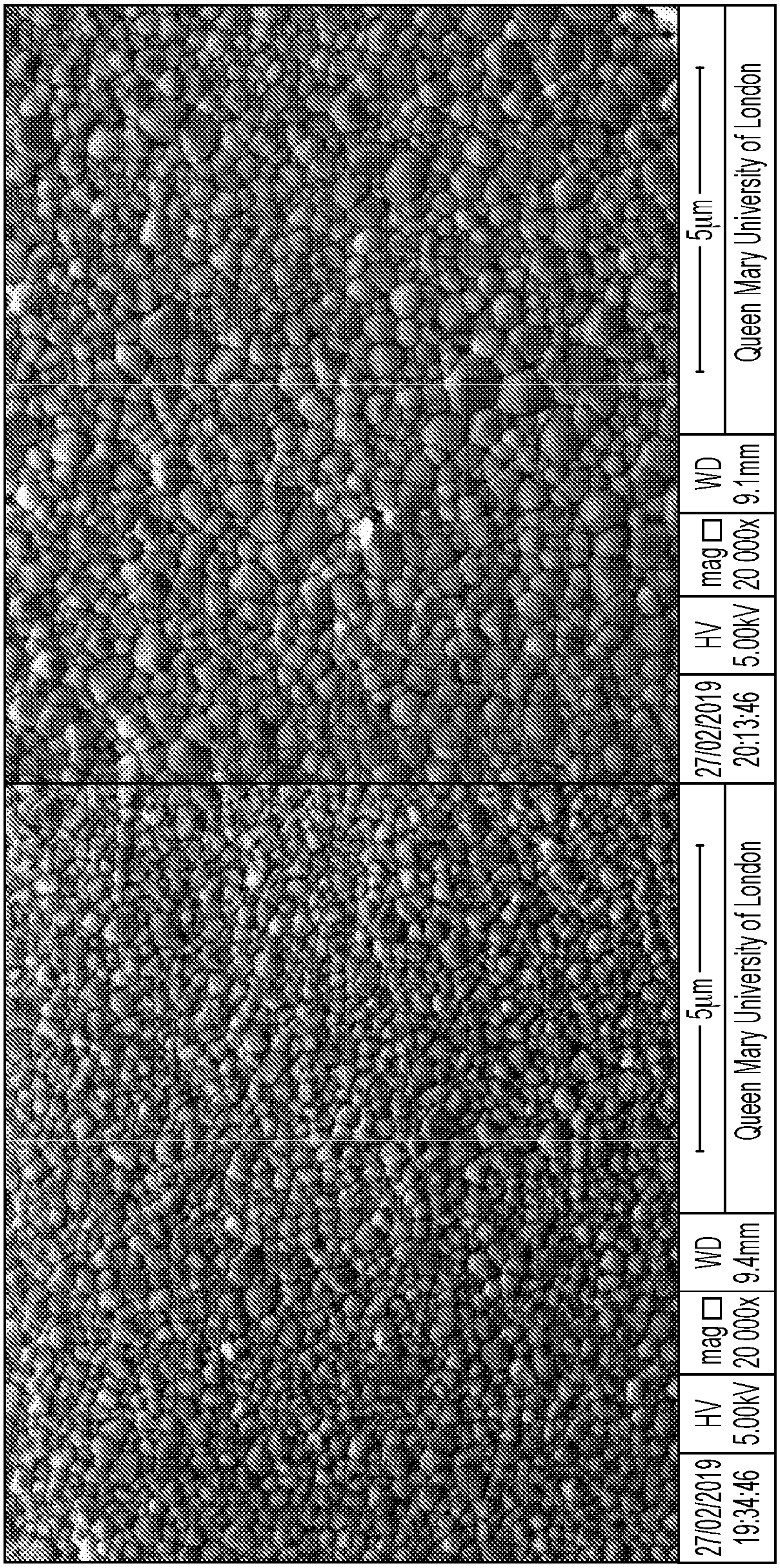
FIG. 7 comprises SEM images depicting the effect of treatment with aerosol for varying times.

A particularly advantageous condition is achieved with treatment time in the range of from about 6 to 7 minutes, e.g. 5 minutes with flow rate of 0.5 L/min, which results in a surface roughness <40 nm, typical thickness of ETL layer. FIG. 7 comprises SEM images depicting the effect of treatment with aerosol at a flow rate of 0.1 l/min DMF exposure with varying times. A slightly coarser grain structure results with longer time; average grain size is 230 nm at 5 min and 400 nm at 20 min.

Figure 8A:
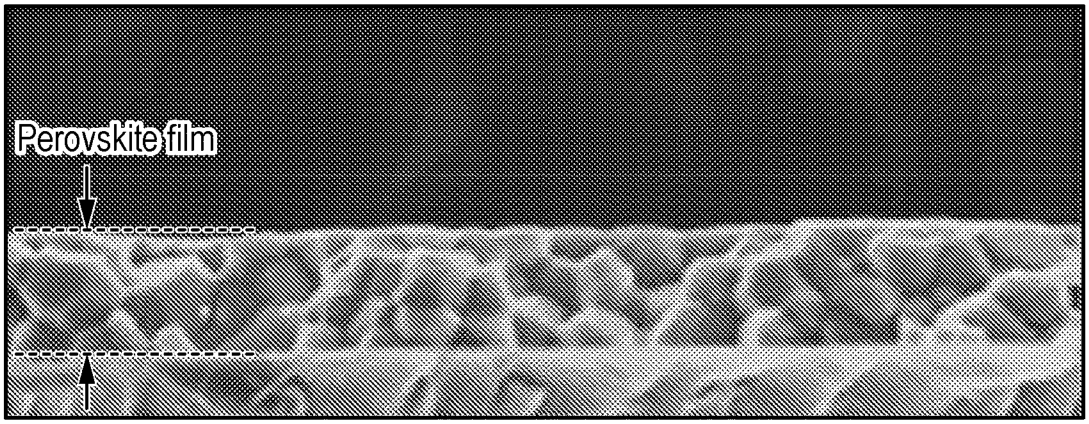
FIGS. 8A to C are scanning electron microscope images of an untreated perovskite film and films treated for different periods of time.
Figure 8B:
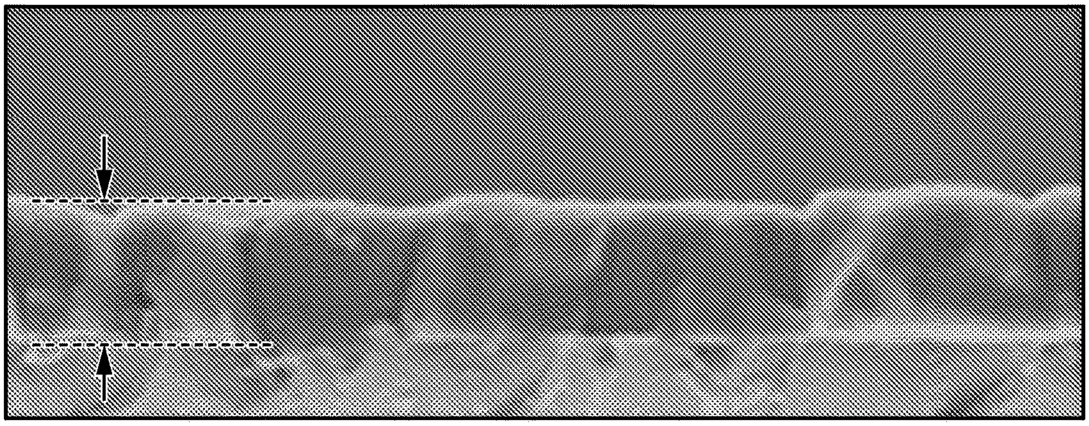
Figure 8C:
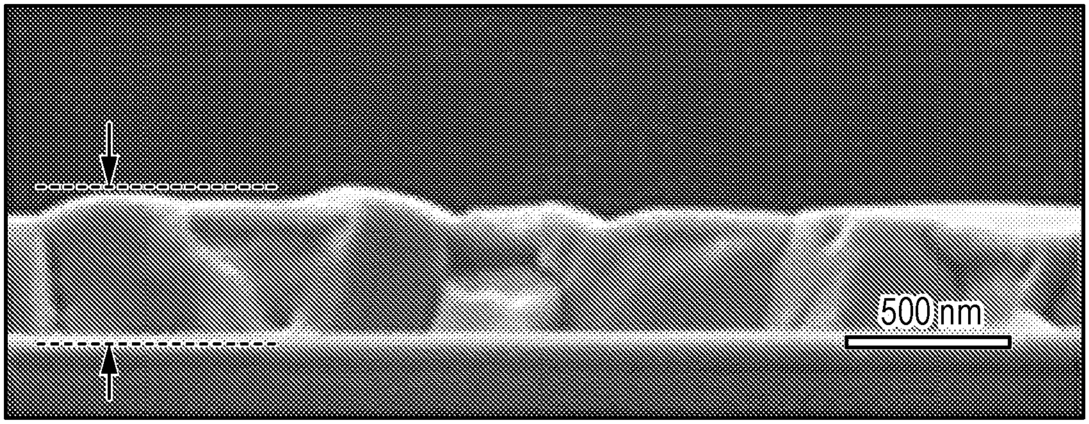

More details of the effect of increasing aerosol treatment by increasing the treatment time is shown in FIGS. 8A to C. These are Scanning electron microscope (SEM) cross-sections of respectively an untreated film, a film treated with an aerosol for 5 minutes and a film treated with an aerosol for 10 minutes. The figures show a clear increase in grain size, both in-plane and out-of-plane, as the aerosol exposure time is increased. It was also found that both the overall PL lifetime and yield increase with increased treatment time, indicating a reduction in trap-mediated recombination. Normally such enhancements in the PL correlate with improvements in device performance. Thus, devices were tested incorporating untreated and treated films in the configuration. It was found that treatment time of 5 minutes is beneficial to device performance but increasing the treatment to 10 minutes can be detrimental to several device performance parameters, despite the increases in grain size and PL lifetime and yield. It is believed that a potential cause for this is that the increasing grain growth is associated with an increase in surface roughness. This roughness creates several issues including pinhole formation or inhomogeneous coverage of subsequent layers in a device stack. Thus we find that the optimum balance between enhanced grain size and film roughness occurs at 5 minutes of aerosol exposure.

Figure 9A:
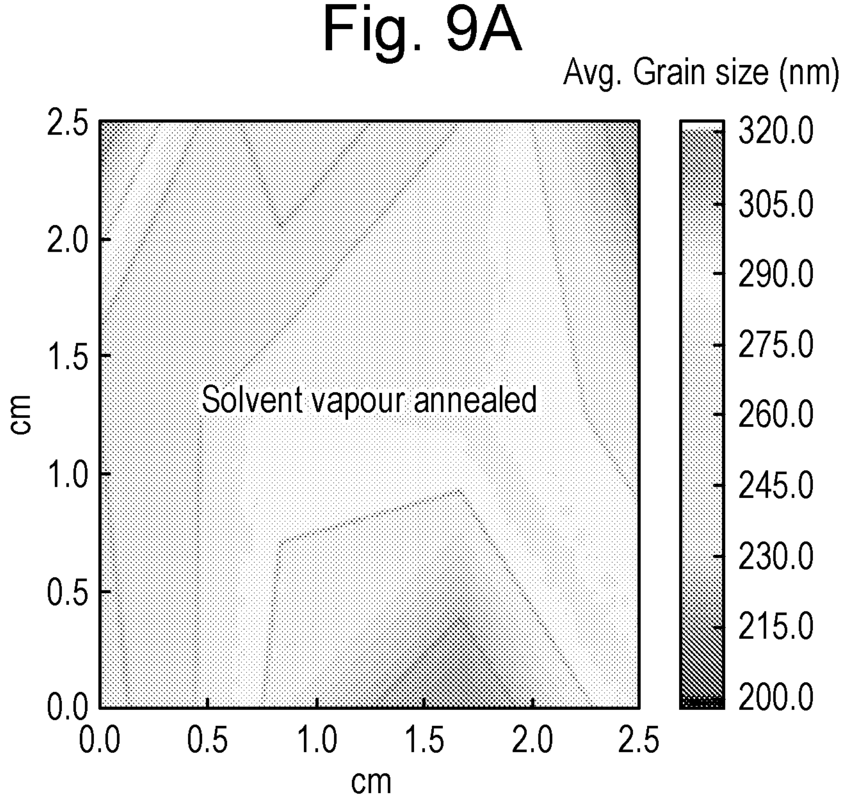
FIGS. 9A and B show the grain size distribution for aerosol-treated and SVA films.
Figure 9B:
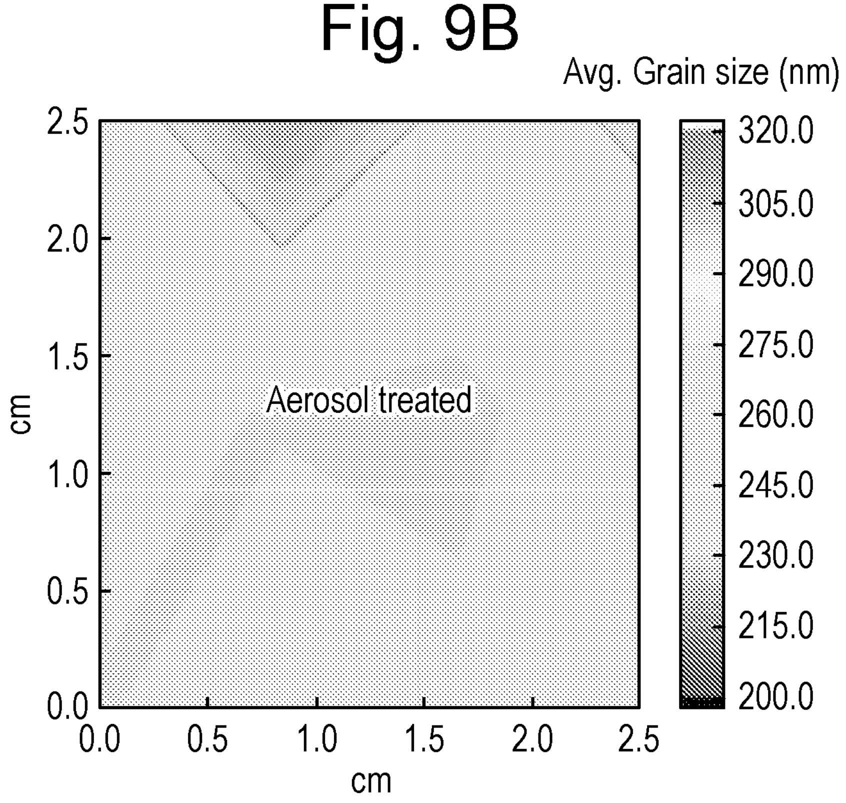

To assess the consistency and uniformity of our aerosol treatment in comparison to SVA devices prepared using our optimised aerosol treatment were compared with those treated using SVA. A remarkable consistency in the performance of individual pixels in the aerosol-treated devices was found. In contrast, those treated by SVA show a large distribution in their metrics. To understand the origin of the device consistency after aerosol treatment, and in parallel to demonstrate the scalability of our technique, we extend the substrate dimensions to 2.5×2.5 cm and evaluate the uniformity of the grain size enhancements by each treatment. FIGS. 9A and B show the grain size distribution for aerosol-treated and SVA films measured across each substrate using SEM. Both solvent treatments increase grain size significantly, with the mean grain size between both techniques being comparable. However, the size distribution of the SVA films is considerably greater. Therefore, we can begin to correlate the impact of grain size and grain size homogeneity on device performance.

Despite both post-deposition treatments being superficially similar, the aerosol treatment effect is more uniform across the substrate area. This uniformity can be attributed to the controlled aerosol flow within the reactor. It has been shown using computational fluid dynamics simulations that the laminar nature of this flow produces a boundary layer between the aerosol stream and the substrate. This allows for a more controlled diffusion of the solvent across the boundary layer enabling a uniform interaction of solvent with the perovskite film surface, whilst preventing unwanted issues such as vapour condensation. In contrast, during SVA the solvent flow is uncontrolled, being driven by convective flows. This results in inconsistent solvent interaction with the film surface, leaving some areas of the films underexposed, and others overexposed. This leads to a larger spread in device performance.

Microstructural Characterisation

Figure 10A:
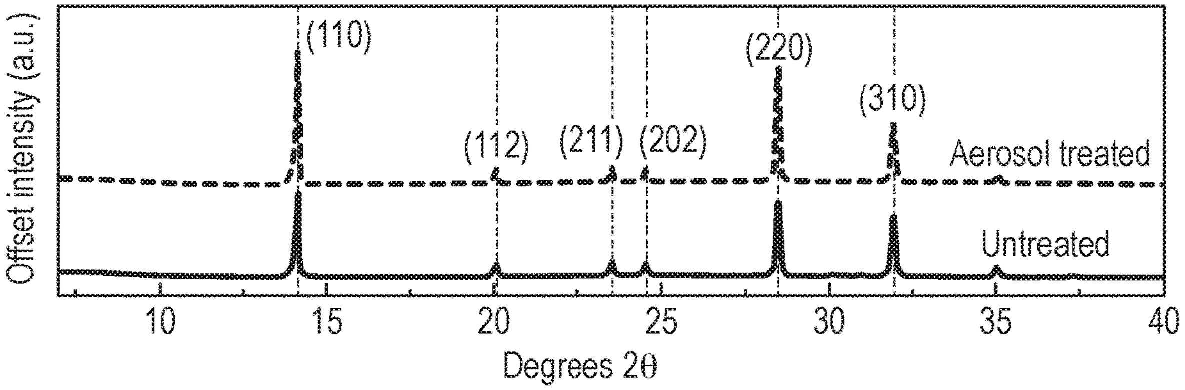
FIGS. 10A and 10B are X-ray diffraction spectra of untreated and aerosol treated film.
Figure 10B:
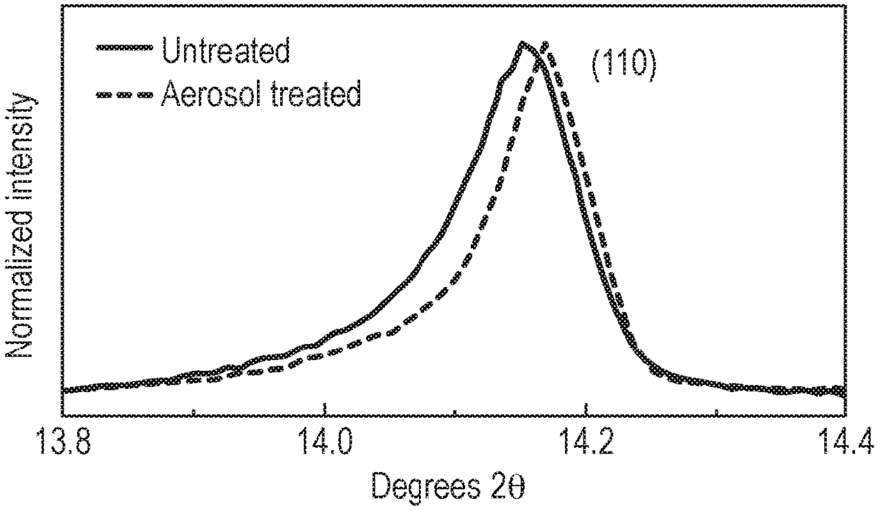

Structural analysis using X-ray diffraction (FIGS. 10A and 10B) reveals significant increases in the crystallinity of the aerosol treated films with the development of a preferential (110) crystallographic orientation. Closer analysis of the (110) diffraction peak at around 14.1° 2θ shows a reduction in the peak full width at half maximum (FWHM), which is consistent with aerosol treatment inducing an increase in crystallite size. There is also a slight shift in the peak position, which may be indication of a subtle change in the lattice parameters.

Overall, therefore, XRD data indicates crystallites grow and increase their preferred orientation, all of which contribute towards the observed improvements in device performance.

Energetic and Spectroscopic Characterisation

We now consider the electronic and optoelectronic properties of the $MAPbI_3$ films in more detail to understand the mechanisms through which the above improvements in microstructural properties impact the device performance. It is believed that aerosol treatment significantly reduces the electronic trap states within the perovskite film. There may also be a reduction in p-type character following aerosol treatment indicating that there are fewer ionic defects acting as p-type dopants in the aerosol treated films, e.g. Pb vacancies, consistent with all other analysis, although we note that the p-doping can also be influenced by the underlying HTL.

Demonstrating Versatility of Aerosol-Assisted Solvent Treatment

Figure 11:
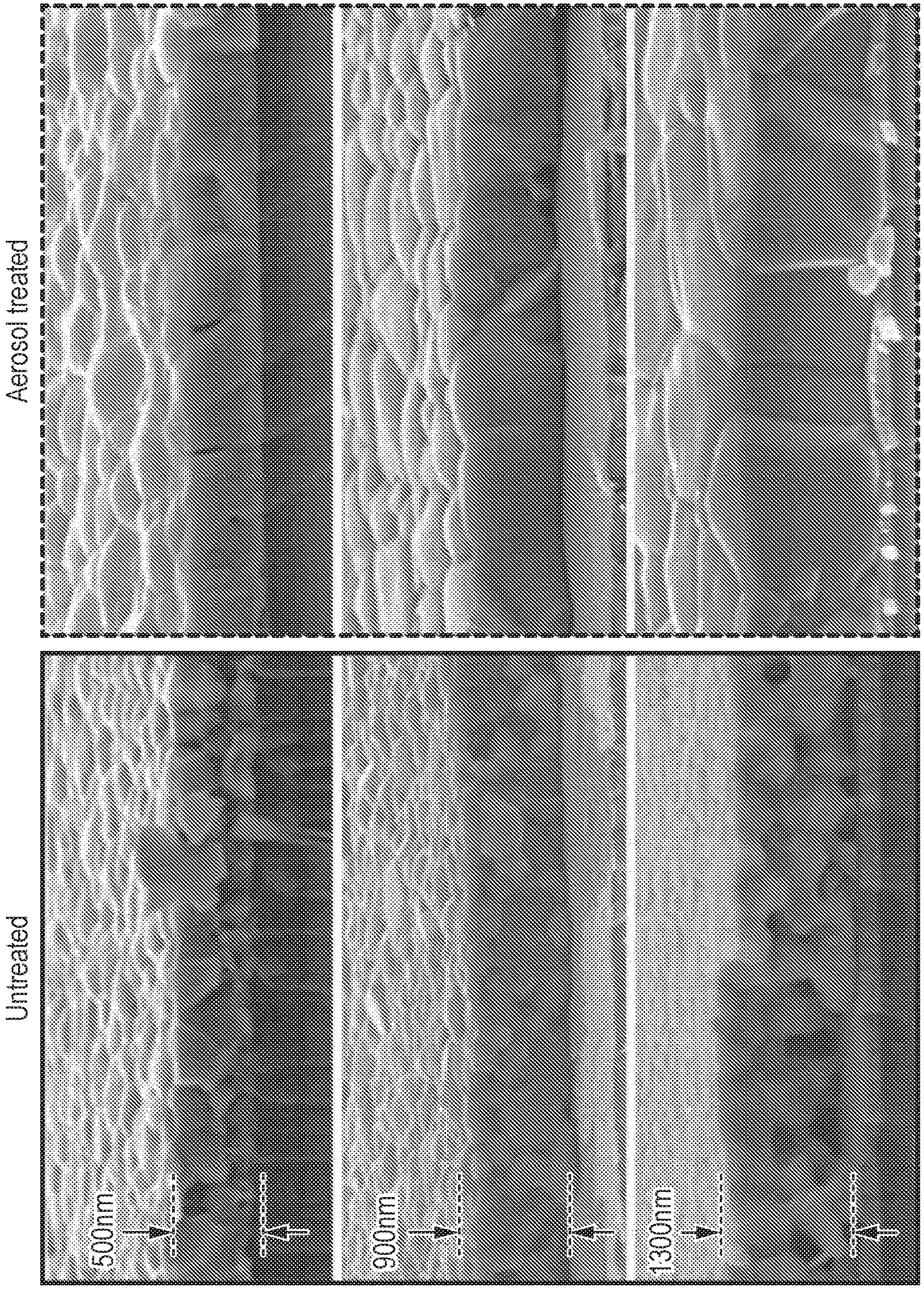
FIG. 11 shows cross-sectional SEM images of untreated and aerosol treated $MAPbI_3$ films of different nominal thicknesses.

Typically, the active layer within high-performing perovskite cells is around 500 nm thick. Whilst perovskites have shown diffusion lengths in excess of this length, grain boundaries and the resulting trap states have limited the optimum thickness used in devices. This limits the maximum amount of light the active layer can absorb and constrains thickness tolerances, making large scale deposition more difficult. Therefore, considering the reduction in GBs and improvement in film properties, we investigated the effect of our aerosol treatment on thicker perovskite films of 900 and 1300 nm. FIG. 11 shows cross-sectional SEM images of untreated and aerosol treated $MAPbI_3$ films of nominal thickness 500, 900 and 1300 nm. Cross-sections of the thick films reveal vertically stacked grains through the active layer thickness, where grain size appears to be insensitive to film thickness. Following aerosol exposure there is a significant change in the $MAPbI_3$ grain size and shape, with the small grains of the untreated films being replaced by monolithic grains that extend through the film thickness, a structural feature that appears independent of film thickness. The grain size in the aerosol treated films now shows a dependence on film thickness with larger grains being formed in thicker films. This suggests a significant structural reorganisation and recrystallisation and demonstrates that it occurs throughout the film thickness even in films up to 1300 nm thick. These observations suggest that the aerosol treatment is allowing significant structural reorganisation and recrystallisation but is doing so without complete dissolution of the untreated films as thickness remains relatively constant after aerosol treatment.

Overall, these results show that the aerosol treatment can be readily applied to perovskite films with a large variation of film thickness, resulting in consistent improvement of film quality and thus high performing devices.

The aerosol treatment has also been tested on various different perovskite materials and can be expected to show improvements on all such materials. A perovskite material is a material with a perovskite crystal structure and the general chemical formula $ABX_3$, where 'A' and 'B' are two cations, and X is an anion. The A cation may represent a single cation or a mixture of cations. The B cation may be a single cation or a mixture of cations. The X anion may be a single anion or a mixture of anions. The X anion typically bonds (ionically) to both the A and B cations. The ideal cubic structure has the B cation in 6-fold coordination, surrounded by an octahedron of anions, and the A cation in 12-fold cuboctahedral coordination. The perovskite material may have the formula $A^1_pA^2_qA^3_rB(X^1_sX^2_tX^3_u)_3$, in which: $A^1$, $A^2$ and $A^3$ are each independently caesium, an alkylamine cation, an alkyldiamine cation such as formamidinium (FA), an imidazolium cation or an amidine cation, or guanidinium; p q and r are each independently 0 to 1, provided that p+q+r=1; B is Pb or Sn; $X^1$, $X^2$ and $X^3$ are each independently a halide or a pseudohalide; and s, t and u are each independently 0 to 1, provided that s+t+u=1. Examples of the alkylamine cation include $C_{1-5}$ alkylamine cations such as methylammonium, MA. Alkyldiamine cations in which both amine groups are bound to the same carbon atom can be drawn either in diaminocarbocation form or amindinium form, as shown below:

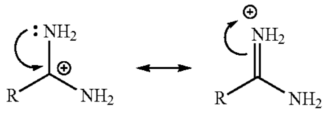

diamino-carbocation amidinium in which R is H or alkyl. Thus, for the avoidance of doubt, the term "alkyldiamine cation" as used herein includes cations which might alternatively be termed an amindinium cation. Examples of the alkyldiamine cation include $C_{1-5}$ alkyldiamine cations such as methylenediamine. Examples of the halide include Cl, Br, and I, and examples of pseudohalides include SCN.

Specific examples of materials which have been shown to benefit from the present invention are:

$CH_3NH_3PbI_3$
$Cs_{0.15}(HC(NH_2)_2)_{0.85}Pb(I_{0.95}Br_{0.05})_3$
$CH_3NH_3PbI_{0.82}Br_{0.12}$
$Cs_{0.15}(HC(NH_2)_2)_{0.85}Pb(I_{0.9}Br_{0.1})_3$
$Cs_{0.1}(HC(NH_2)_2)_{0.9}Pb(I_{0.95}Br_{0.05})_3$
$HC(NH_2)_2PbI_3$

The aerosol treatment has also been shown to be useful for formamidinium (FA)-based perovskites. These perovskites are attractive due to their excellent thermal stability, although their PCEs are normally lower that MA- or MA-FA-based counterparts. FA-perovskite films with a nominal composition of $Cs_{0.1}FA_{0.9}Pb(I_{0.95}Br_{0.05})$ were fabricated with a p-i-n architecture where incorporation of cesium (Cs) alongside FA stabilizes the perovskite structure. Statistics of PCE show an improvement in the average PCE, from 18.6±0.3% to 19.7±0.3% after aerosol treatment. Calculated photovoltaic parameters reveal that such improvement is driven mainly by an increase of $V_{OC}$ and FF. J-V curves of the champion device show a PCE of 19.0% for the untreated device and 20.1% for the aerosol treated device, while minimal J-V hysteresis is seen in both devices. The aerosol-treated device has an integrated external quantum efficiency (EQE) of 23.0 mA $cm^{-2}$ that correlates well with the measured $J_{SC}$. Characterization of the $Cs_{0.1}FA_{0.9}Pb(I_{0.95}Br_{0.05})$ films show an increase of grain size and improvement in crystallinity after aerosol treatment is implemented, which correlates to a reduction of trap states in these films. This is all consistent with the modifications that have been observed on $MAPbI_3$ films.

Device Stability and Large Area Devices

A number of strategies focussing on active layer crystallinity and its impact on device stability have been reported. It is therefore interesting to consider how the improvements in crystallinity and reductions in defect density we observe influence operational stability. Preliminary results suggest that the stability of the aerosol-treated device is enhanced greatly in an $N_2$ atmosphere and in ambient conditions, although the overall operational lifetime for both untreated and aerosol-treated devices is much shorter in ambient conditions. Thus the enhanced crystallinity achieved by aerosol treatment, combined possibly with increased phase purity results in devices with enhanced stability.

As well as stability, scale-up of device area is also critical for future implementation of PSCs. Preliminary results suggest that aerosol treatment reduces the fall off in PCE with increasing area compared to untreated devices. The reduction of PCE loss when device area increases is ascribed to improvements in homogeneity induced by the aerosol treatment eliminating local photoinactive regions or blocking shunt pathway as grain size grows.

Alternative Device Architectures

It is anticipated that the aerosol-treatment approach described above is applicable to devices with a range of HTLs, devices with an n-i-p architecture and HTL-free devices. The latter are attractive owing to ease of preparation, particularly high-volume manufacturing, but normally yield lower performing devices. It is expected that the combination of increased film crystallinity, reduced ionic defects and the reduction in p-doping of the perovskite collectively create more favourable band bending at HTL/perovskite or ITO/perovskite interface that reduces surface recombination. In addition increasing the average PCE values due to aerosol treatment, it is expected that the spread in all characteristics will also be reduced, i.e. aerosol treatment will create better-performing devices with statistically less variance in performance.

It is expected that aerosol treatment will lead to a reduction in ionic defects which in turn is expected to lead to a reduction in J-V hysteresis.

Variations

Numerous variations on the above described methods are possible. For example, alternative solvents can be used, including:

Water (in particular for MA-free compositions)
Methanol
Ethanol
Isopropanol
2-Methoxyethanol
Acetone
Acetonitrile
Ethyl acetate
Chlorobenzene
Dimethyl sulfoxide or any mixture thereof.

The solvent is typically a polar solvent. As is evident from the list above, the solvent may be polar protic (e.g. water (in particular for MA-free compositions), methanol, ethanol, isopropanol, 2-methoxyethanol, or any mixture thereof), or polar aprotic (e.g. acetone, acetonitrile, ethyl acetate, chlorobenzene, dimethyl sulfoxide, or any mixture thereof).

Various solutions can be introduced to the aerosol in order to simultaneously dope the perovskite. For example:

MAX, FAX, GAX, CsX, RbX, KX, NaX in DMF (X=Cl, I or Br)
MAX/FAX in methanol
MAX in $H_2O$
NB: use of alternative halides (particularly Br), cations (e.g. FA) can also lead to doping of films with that ion
Pseudo-halide: MASCN, FASCN, PbSCN, CsSCN
Hydroiodic/Hydrobromic acid
Boric acid (Introduce Boron 10, for applications in neutron detectors)

Additives can be included in the aerosol in order to alter various properties of the perovskite layer being treated. For example, interlayer/passivation additives can be included to improve stability of perovskite or quality of interface with subsequent layer. It is also possible to add organic charge transport and contact layers to the solution, so that they are deposited at the same time as the film is treated. Examples of such layers include PCBM, BCP, NFA's, PEDOT:PSS, PTAA and other small molecules/polymers Abbreviations MA=Methylammonium, $CH_3NH_3$
FA=Formamidinium, $CH(NH_2)_2$
GA=Guanidinium $C(NH_2)_3$
PCBM=Phenyl-C61-butyric acid methyl ester
BCP=Bathocuproine
NFA=Non-fullerene acceptor
PEDOT:PSS=poly(3,4-ethylenedioxythiophene) polystyrene sulfonate
PTAA=poly(triaryl amine)

Organic and inorganic halide salts (iodides, chlorides and bromides) can be used as additives to the aerosol to enhance the grain growth process, leading to very large grains. Specific halide salts that are useful include MAI, FAI, FABr, CsI.

The aerosol process of the invention can be used to stabilise the α-phase of pure $FAPbI_3$ perovskite material. $FAPbI_3$ is of strong interest for perovskite solar cells (PSCs) as it is more chemically and thermally stable than more commonly used compounds that contain methylammonium (MA), e.g. $MAPbI_3$. The main challenge in using $FAPbI_3$ for PSCs is that there is a tendency for the desired, light-absorbing α-phase to go through a transition to the yellow δ-phase due to thermodynamic instabilities. In general stabilisation of α-phase of pure $FAPbI_3$ has been achieved by using additives such as formate, isopropylammonium chloride or methylammonium thiocyanate. Another approach has been to add a small amount of Cs, but this can lead to processing challenges as well as potential phase segregation.

An additional challenge of $FAPbI_3$ perovskites is that they generally require annealing at 150° C. for 20-30 minutes to fully crystallise the α-phase, compared to 100° C. for most other halide perovskites. This means that more energy is required to produce them, and limits the choice of materials used underneath the perovskite layer by their thermal stability. Furthermore, the need to anneal at 30 minutes is very limiting for commercial processing, particularly roll-to-roll where short processing times are required.

The aerosol process of the present invention used on $FAPbI_3$ can produce pure α-phase $FAPbI_3$ using aerosol annealing at only 100° C. for under 5 minutes. It can also produce $FAPbI_3$ that is much more stable in the α-phase than equivalent films thermally annealed at 150° C.

Conclusions

We have introduced a novel post-deposition treatment universally applicable to a wide range of perovskite solar cell configurations and architectures. The treatment is applied after crystallisation of the perovskite, which may take from a few seconds to several minutes. Desirably the perovskite is in its final composition before application of the aerosol; the aerosol annealing process only affects its crystalline phase and/or morphology and/or crystallinity. There can be a delay of a few seconds or longer between formation of the perovskite layer and application of the aerosol annealing technique of the invention. Thermal annealing, and other treatments steps, can optionally be performed before aerosol annealing. Desirably the perovskite layer is substantially free of any precursor compounds before aerosol annealing is performed. However, if there happen to be any unwanted residual precursor compounds (e.g. $PbI_2$) present on the perovskite layer, these can be removed by the novel process. The methodology yields significant improvements in device efficiency and lifetime coupled with a reduction in inherent batch-to-batch variability in all performance metrics. Such improvements are achieved following an aerosol-induced recrystallisation of solution-deposited $MAPbI_3$ thin films that result in a significant enlargement and improved homogeneity of grain size. The aerosol treatment is demonstrated as being suitable for a range of active layer thicknesses, interlayer choices, architectures and device active areas. Significantly, all benefits can be obtained without modification of existing deposition methods or the introduction of compositional modulation through additives. In addition to increasing grain size and crystallinity our process enables the removal of degradation products and significantly reduces ionic and electronic defects. The synergistic improvements in structure, composition and defect chemistry allow for the preparation of champion p-i-n $MAPbI_3$ devices with a PCE of 20.8%, $MAPbI_3$ devices with active areas exceeding 1 $cm^2$ with a PCE of 17.6% and remarkably HTL free devices with PCEs>15%. Importantly, this method is scalable and we have shown that it can improve large-area uniformity and improve the efficiency of thicker active layers. All of these features make this technique highly suitable for large-volume manufacturing of PSCs. Furthermore, the highly-controlled nature of this technique could be further applied to the fundamental study of perovskite materials, where the controlled grain growth, defect and dopant tuning could allow property-performance relationships to be studied in greater detail in the future. Therefore, the simplicity, versatility and reproducibility of our method should enable its immediate uptake by researchers in the field to study these interesting properties and enable improvements in future devices.

The present invention proposes aerosol-assisted solvent treatment as a widely applicable method to obtain performance enhancements in PSCs. Aerosol-assisted solvent treatment is a convenient, scalable and reproducible tool for the post-deposition processing and performance enhancement of perovskite solar cells. The present invention can particularly provide improvements in methylammonium lead iodide crystallinity and grain size, accompanied by a reduction in grain size distribution, as the underlying physical changes that drive reductions of electronic and ionic defects. These changes lead to prolonged charge-carrier lifetimes and increased device efficiency. The process is applicable for PSCs with thick (>1 μm) active layers, large areas (>1 $cm^2$), and a variety of device architectures. The process can be applied through a charge transport layer, i.e. after a charge transport layer has been formed on the perovskite layer.

Having described the invention it will be appreciated that variations may be made on the above described embodiments which are not intended to be limiting. The invention is defined in the appended claims and their equivalents.

Experimental Details

Perovskite Film Deposition

The precursor solution for typical 500 nm thick $CH_3NH_3PbI_3$ ($MAPbI_3$) devices was prepared by dissolving equimolar concentrations (1.5 mol $dm^{-3}$)lead iodide ($PbI_2$, 99.985%, TCI) and methylammonium iodide (MAI, Dyesol) in a mixture solvent of N,N-Dimethylmethanamide (DMF) and dimethyl sulfoxide (DMSO) (9:1.1 in volume ratio). The solution was passed through a 0.45 μm PTFE filter before use. 40 μl precursor solution was dropped onto each substrate and spun at 4000 rpm for 30 s. At the $7^{th}$ second, 0.5 ml diethyl ether was dripped onto the spinning substrate. The reference perovskite films were annealed on a hot plate at 100° C. for 20 minutes.

Aerosol Treatment of Perovskite Films

The perovskite films were pre-annealed at 100° C. two minutes to dry most of the solvent prior to aerosol treatment. Films were then placed within the pre-heated reactor, with the temperature set at 105° C. The treatment was carried out by flowing aerosolized DMF into the reactor at 0.5 $dm^3$ $min^{-1}$ for 5 minutes. The aerosol was generated using a piezoelectric generator. For standard devices the substrates were placed in the central section of the reactor, approximately 4 cm from the aerosol inlet. After the 5 minutes elapsed, the aerosol flow was switched to $N_2$ and the samples were left on the heated graphite block for a further 5 minutes at the same temperature to sweep out the remaining DMF in the chamber. Samples were then left to cool and were removed and placed into the glovebox for additional thermal annealing of 20 minutes.

In comparison, conventional solvent vapor annealing (SVA) was carried out by placing the perovskite films on a hot plate heating at 100° C. that were covered with a glass petri dish. 20 μl of DMF was uniformly spread around the edge of the petri dish. After 5 minutes the petri dish was removed, and the films removed and placed into the glovebox for additional thermal annealing of 20 minutes.

Solar Cell Fabrication and Characterization

By way of an example, solar cell devices can be fabricated on indium-doped tin oxide (ITO) coated glass substrates sequentially cleaned in acetone, isopropanol and deionized water (using ultrasonics) for 10 minutes followed by a $N_2$ dry. Prior to deposition the substrates can be treated by oxygen plasma for 10 minutes.

For p-i-n PSCs, Poly(N,N'-bis-4-butylphenyl-N,N'-bisphenyl)benzidine (PolyTPD, 0.25 wt. % in chlorobenzene) can spin-coated onto the ITO at 5000 rpm for 20 s as hole transport layers (HTL). After drying for 1 minute, Poly[(9,9-bis(3'-((N,N -dimethyl)-N-ethylammonium)-propyl)-2,7-fluorene)-alt-2,7-(9,9-dioctylfluorene)] (PFN-Br, 0.05 wt. % in methanol) can be spin-coated onto the HTLs at 5000 rpm for 15 s as interfacial modifier to reduce surface hydrophobicity. Solutions of the electron transport material can be prepared by dissolving 30 mg/ml phenyl-$C_{61}$-butyricacid methylester (PCBM, Ossila) in chlorobenzene. The solution can be stirred at 40° C. for 1 h prior to use and filtered through a 0.45 μm PTFE filter before use. The PCBM solution can be spin-coated on to MAPI films at 2000 rpm for 45 s. An ultra-thin interfacial dipole layer can be prepared by spin coating Bathocuproine (BCP) solution (0.5 mg/ml in methanol) on top of PCBM layer at 4000 rpm for 30 seconds. Finally, the devices can be completed by thermally evaporating 100 nm of Cu at a base pressure of $5\times10^{-6}$ mbar.

For n-i-p PSCs, tin(IV) oxide (15 wt. % in $H_2O$ colloidal dispersion, Alfa Aesar) can be diluted with deionized water to 2.5 wt. % and spin-coated onto ITO at 3000 rpm for 40 s. The films can be immediately annealed at 150° C. for 30 minutes in ambient conditions forming a 25 nm $SnO_2$ nanoparticle film. The $SnO_2$ films can then be cooled and further treated by oxygen plasma for 10 minutes to enable sufficient wetting for the next steps. The $SnO_2$ films can then be coated with an ultra-thin layer of PCBM (10 mg $ml^{-1}$ in chlorobenzene) by spin-coating at 4000 rpm in ambient conditions. The ITO/$SnO_2$/PCBM films can then be transferred to a $N_2$ filled glovebox for perovskite deposition. Solution of hole transport material can be prepared by dissolving 10 mg of Poly(triaryl amine) (PTAA, Mw=14,000, Ossila) in 1 ml toluene and stirred for 1 h at 65° C., both carried in a $N_2$ filled glovebox. The solution can then be doped with additives of 3.8 μL bis(trifluoromethane)sulfonimide lithium salt (Li-TFSI)/acetonitrile (340 mg $mL^{-1}$, TCI) and 3.8 μL of 4-tert-butylpyridine (tBP, TCI). The doped PTAA can be filtered through a 0.45 μm PTFE filter before use and spin-coated onto the perovskite films at 3000 rpm for 20 s. Finally, 100 nm of Au can thermally evaporated (0.2 Å/s) at a base pressure of $5\times10^{-6}$ mbar.

Morphological, Physical and Electrical Characterization

The scanning electron microscopy (SEM) images were obtained using an FEI Inspect F field emission scanning electron microscope. The working voltage of SEM was set at 3 to 5 kV. To prevent damage to the films, all films were coated with a thin chromium layer (approximately 10 nm). X-ray diffraction (XRD) patterns were obtained with a X'pert Powder diffractometer (PANalytical), Cu $K\alpha_{1,2}$ $\lambda$=1.542 Å) source. The diffraction patterns were measured over the range 5-55° 2θ. The samples were rotated during measurement.

Atomic force microscopy (AFM) was employed to probe the surface topography using an Asylum MFP-3D operated in tapping mode. Kelvin Probe force microscopy (KPFM) measures the contact potential difference (CPD) between the Pt/Ir coated tip and the sample surface. The measured values are compared with a reference sample for an understanding in the absolute magnitude. Fresh surfaces such as freshly cleaved HOPG surface is used as reference, assuming a constant work function of 4.6 eV. Kelvin probe relies on keeping a constant distance between the tip and the sample surface. In a typical KPFM measurement, the tapping mode is executed first for a line height profile. Upon completion, the cantilever will follow the height profile obtained, and the contact potential difference is measured by keeping a constant distance with the sample surface. Samples are grounded throughout the measurement using carbon tape and silver paste. Statistical and image analysis was performed using Gwyddion software.

X-ray photoelectron spectroscopy were measured with a PHI 5300ESCA Perkin-Elmer X-ray photoelectron spectroscopy (XPS) measurements are conducted on a Thermo Fisher Nexsa spectrometer, with a monochromated Al Ka source and micro focused to a spot size of 300 mm. The instrument is operated in constant analyser energy (CAE) mode. The survey and the high-resolution core level spectra are recorded using a pass energy of 200 eV and 50 eV with a step size of 0.5 eV and 0.1 eV, respectively. In order to compensate the surface charging during measurement, both an electron flood gun and low energy $Ar^+$ beam were used. Data acquired were processed using Thermo Avantage software. Moreover, charge correction is carried out using surface adventitious carbon set to 284.8 eV.

Estimation of Average Grain Size

The spatial uniformity was tested by placing three MAPI coated glass substrates, measuring 2.54 cm×2.54 cm, along the length of the reactor. Samples were treated using the protocol described above and immediately moved to a $N_2$ filled glovebox to await measurement.

Each substrate was divided into 12 equal sized areas and imaged within the SEM. The grain sizes were evaluated from the centre of each sample, using the intercept technique. This involves drawing a line of a fixed length over the image and counting the number of grain boundaries this line intercepts. This measurement was completed 10 times per image, yielding the average grain size.

Photoluminescence and UV-Vis Spectroscopy

Photoluminescence spectroscopy were measured with a Horiba FL 1039 spectrometer, illuminated with 550-nm continuous-wave laser, with step-size of 1 nm and integrating time of 1 s. Time-resolved PL spectroscopy was measured by a time-correlated single-photon counting set up using a Horriba spectrofluorimeter with 404 nm excitation. The intensity of laser was calibrated by a power meter and was tuned with neutral density filters. Two short pass filters with edge of 700 nm were used before samples to cut off the unwanted light after 700 nm and two long pass filters after 700 nm were used before the detectors to avoid white light background. Ultraviolet-visible (UV-Vis) absorption spectra were measured with a Horriba UV-vis spectrophotometer by measuring both transmittance and reflectance spectra of the perovskite films, with step-size of 1 nm and integrating time of 0.5 s. In all cases the perovskite films are deposited on quartz substrates. To avoid any ingression of oxygen or moisture all perovskite films were coated with a PMMA layer, covered with a glass slide and sealed with epoxy in a $N_2$ filled glovebox.

Addition of Halide Salts

Experiments were conducted with 1-100 mM of methylammonium chloride (MACl) added to DMF used this for aerosol annealing of perovskite ($MAPbI_3$) films of up to 10 minutes at 100° C. Further experiments were carried out using other salts including: MAI, FAI, FABr, CsI, KI (where FA=formamidinium). Results are shown in FIGS. 12 and 13.

Figure 12A:
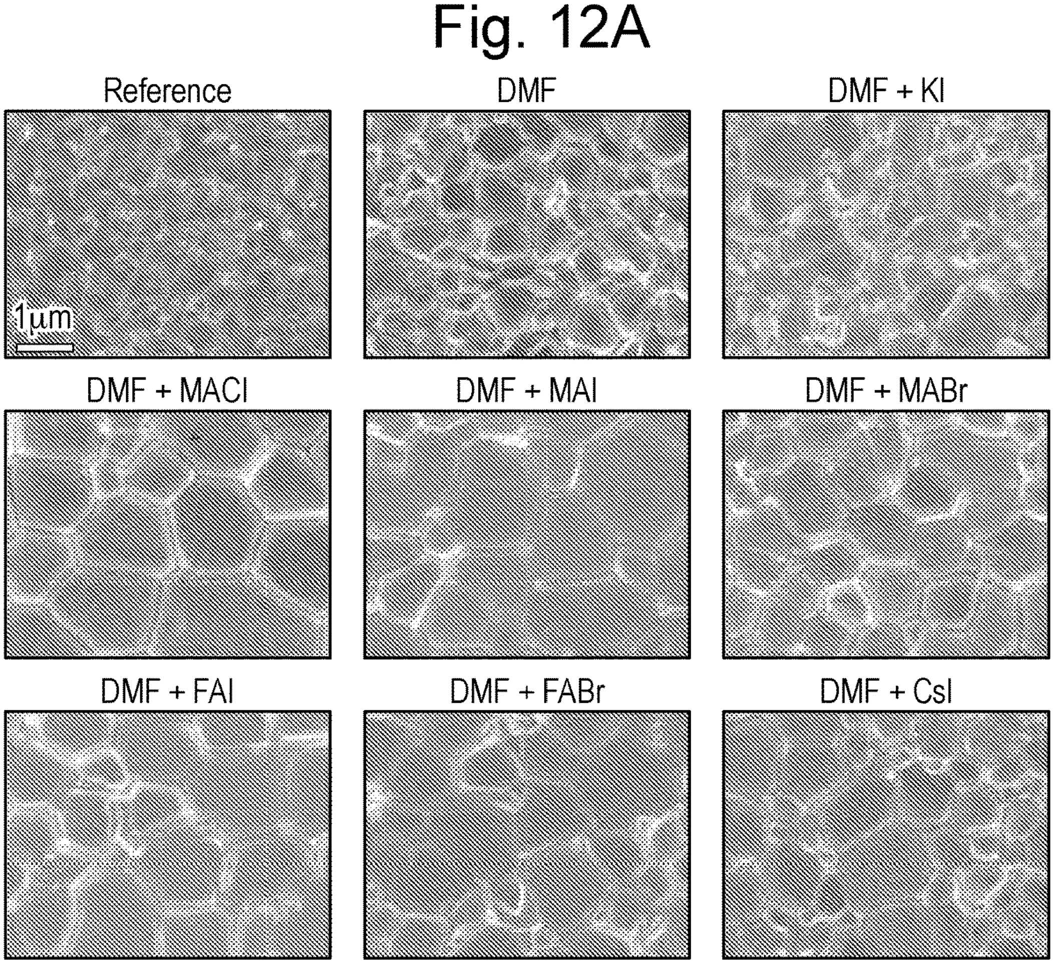
FIG. 12 shows SEM images (a) and associated grain size measurements (b) of layers treated with aerosols including Halide salt additives.
Figure 12B:
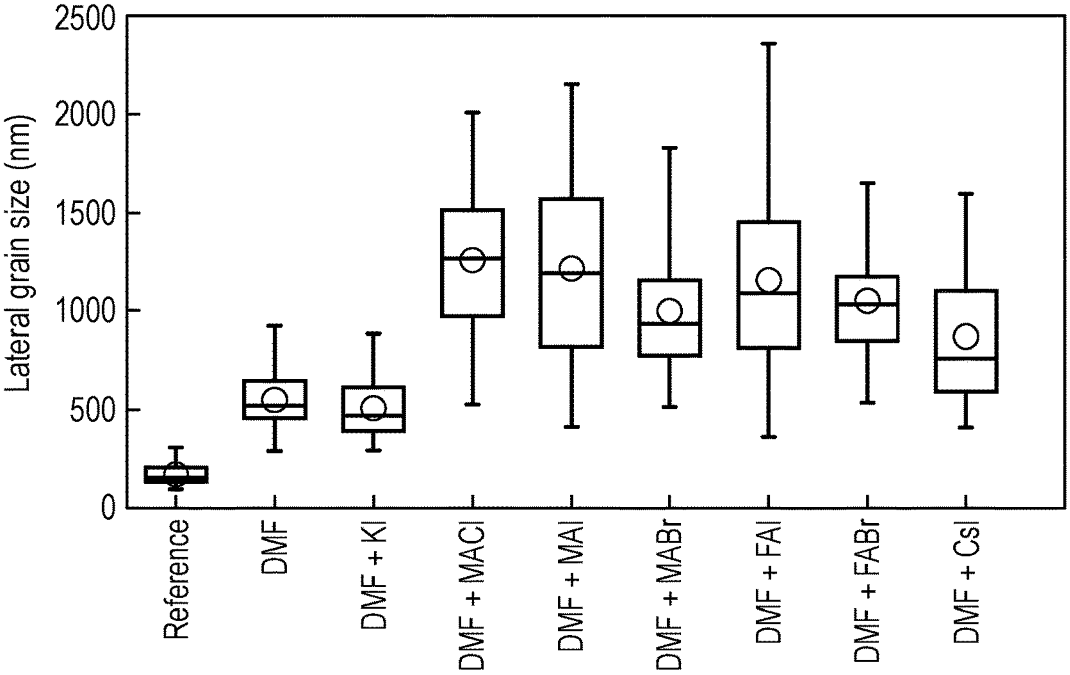
Figure 13:
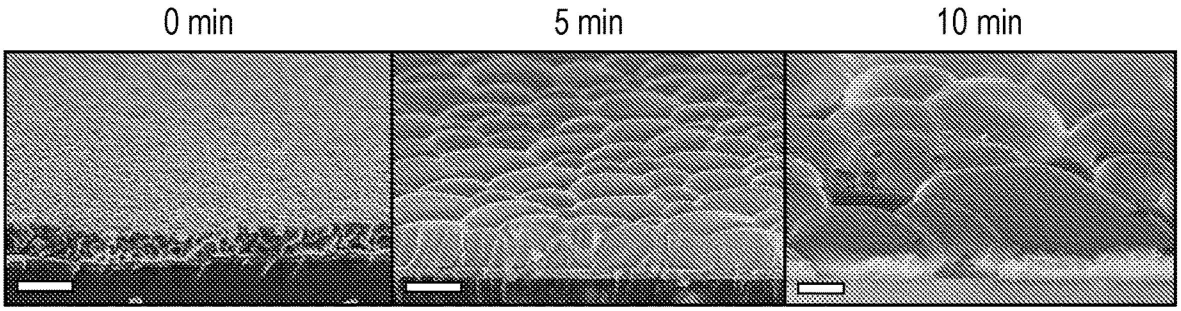
FIG. 13 are SEM images showing the effect of treatment time when using aerosols including Halide salt additives (Scale bars shown are 1 μm)

FIG. 12 shows SEM images (a) and associated grain size measurements (b). It can be seen that for all additives except for KI a large increase in lateral grain size (i.e. grain growth) is achieved. This effect is much stronger than for the pure solvent only (DMF). FIG. 13 shows the effect of treatment time. After 5 minutes large grains are formed, with the film remaining continuous (no pinholes). After 10 minutes grains are even larger, but pinholes have formed. Scale bars are 1 μm.

Aerosol Annealing of $FAPbI_3$ $FAPbI_3$ was spin coated from a solution of formamidinium iodide (FAI) and $PbI_2$ (1.3 mol $dm^{-3}$) in a mixture of dimethylformamide (DMF) and N-Methyl-2-Pyrrolidone (NMP) in a ratio of 7.5:2.5. For thermal annealing, this was placed on a hotplate at 150° C. for 20 minutes, and upon cooling the black α-phase $FAPbI_3$ formed. For aerosol annealing, the film was placed in the reactor and heated to 100° C. An aerosol containing a mixture of DMF and dimethyl sulfoxide (DMSO) was then passed over the film for between 1 and 5 minutes, forming the black α-phase $FAPbI_3$.

Figure 14:
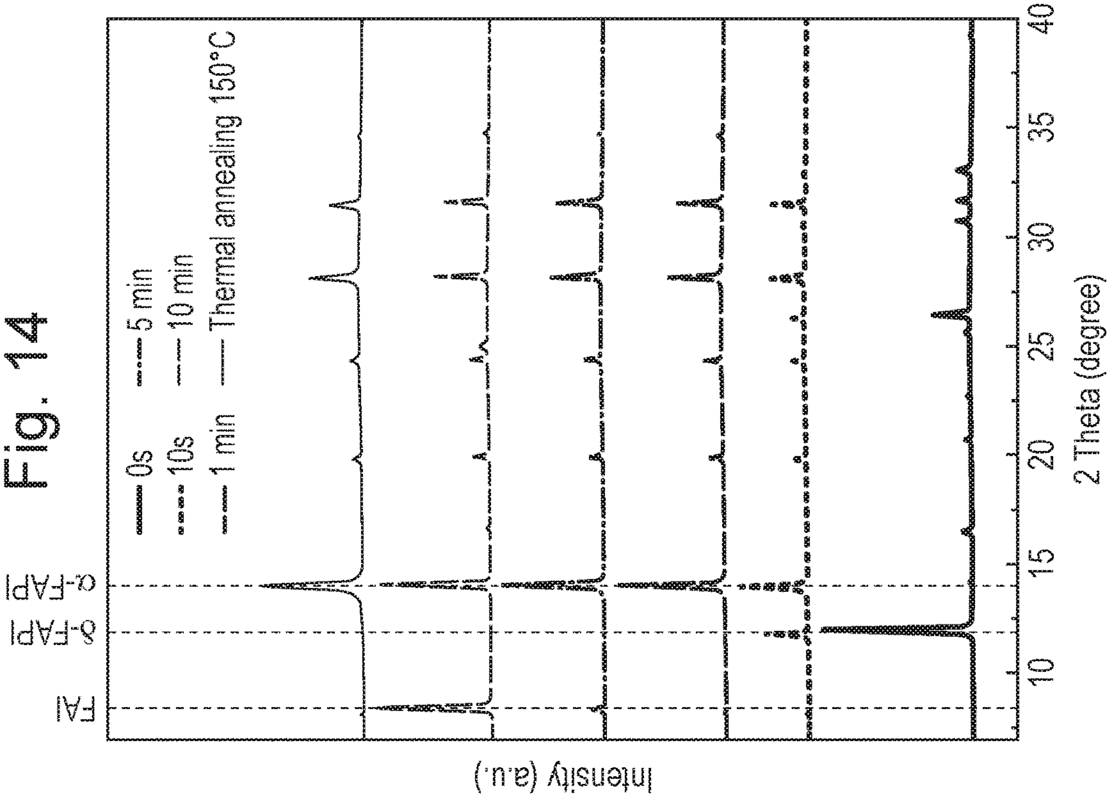
FIG. 14 shows X-ray diffraction (XRD) results comparing formation of α-$FAPbI_3$ for 150° C. thermal annealing for 20 minutes, and aerosol annealing using DMF-DMSO for between 10 s and 10 min.

FIG. 14 shows X-ray diffraction (XRD) results comparing formation of α-$FAPbI_3$ for 150° C. thermal annealing for 20 minutes, and aerosol annealing using DMF-DMSO for between 10 s and 10 min. Formation of α-$FAPbI_3$ starts after only 10 s, and is compete after 1 min. Excess treatment (5-10 min) results in increasing degradation, forming FAI.

Figure 15:
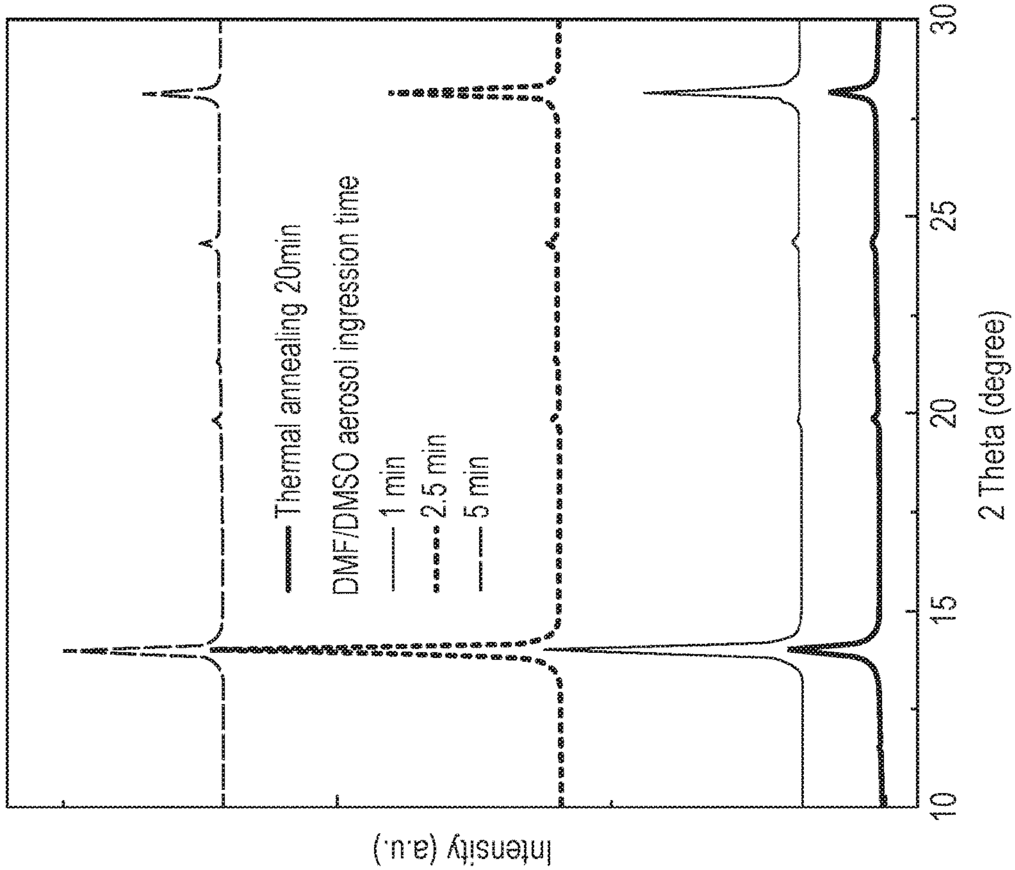
FIG. 15 shows X-ray diffraction (XRD) results for aerosol annealing using DMF-DMSO for treatment times of 1 min, 2.5 min and 5 min.

FIG. 15 shows X-ray diffraction (XRD) results for aerosol annealing using DMF-DMSO for treatment times of 1 min, 2.5 min and 5 min, showing highest crystallinity after 2.5 minutes of aerosol treatment.

Figure 16:
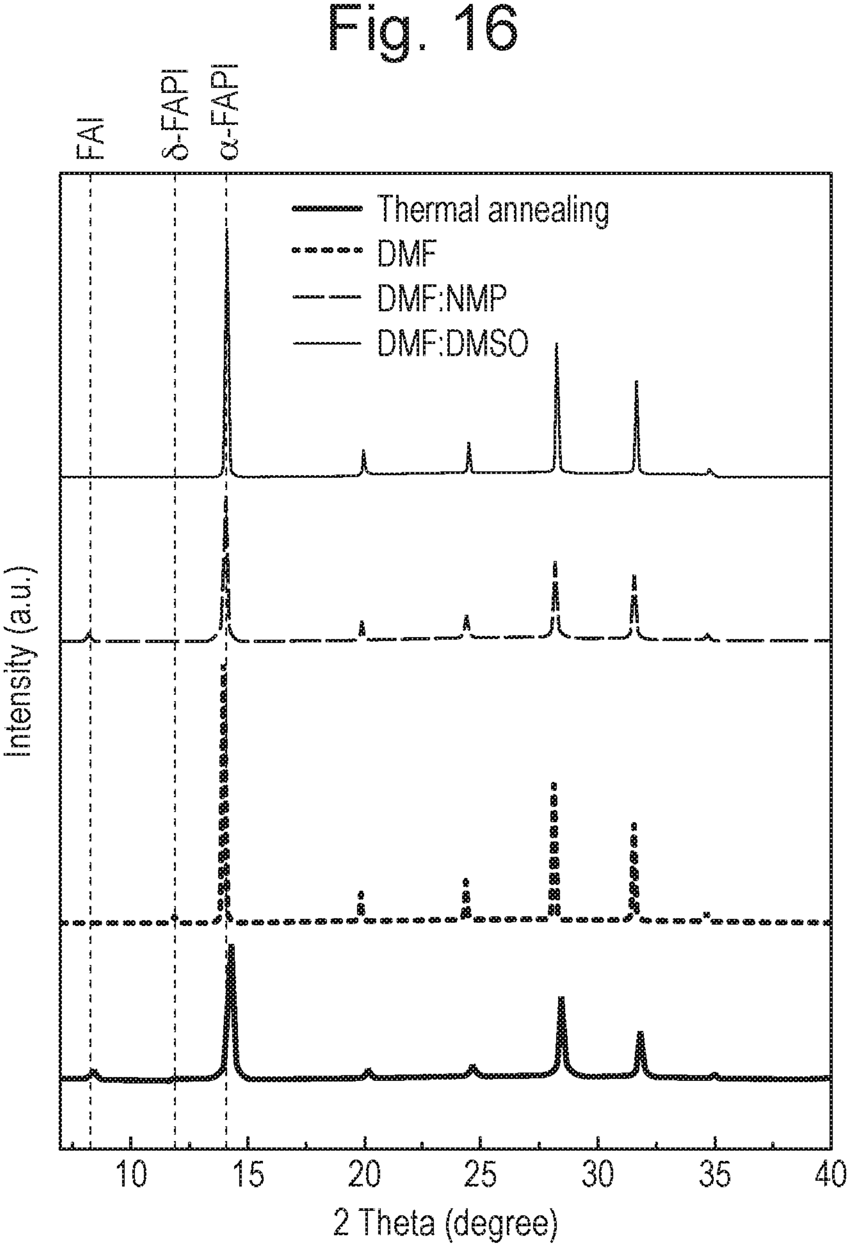
FIG. 16 shows X-ray diffraction (XRD) results for aerosol annealing using different solvents.

FIG. 16 shows X-ray diffraction (XRD) results for aerosol annealing using different solvents, showing best phase stability for mix of DMF and DMSO.

Figure 17A:
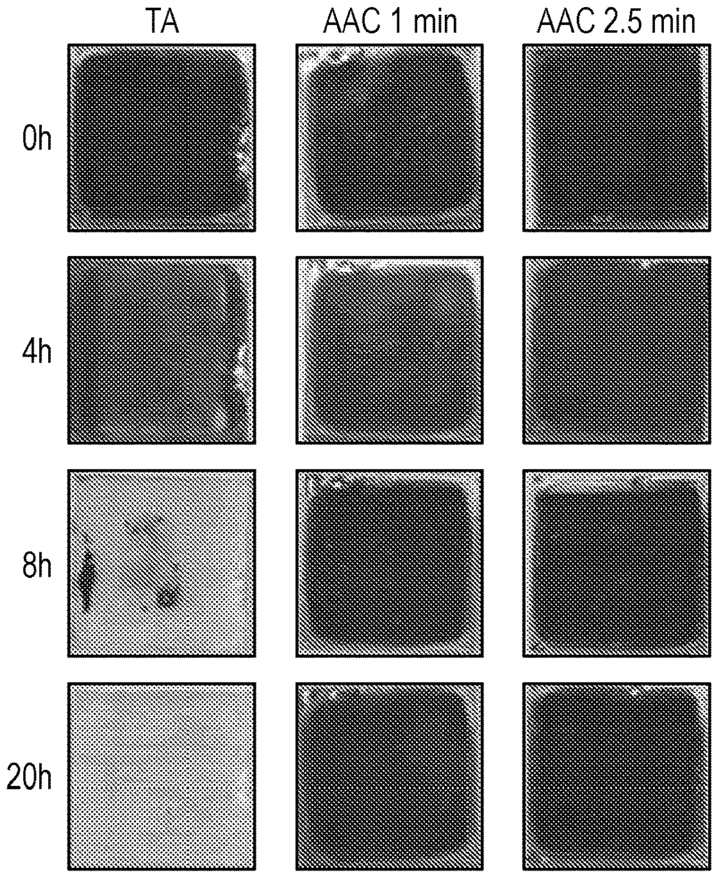
FIG. 17 shows results of aerosol-annealing α-$FAPbI_3$ compared to thermally annealed when bare films are left in air in dark for up to 900 hours.
Figure 17B:
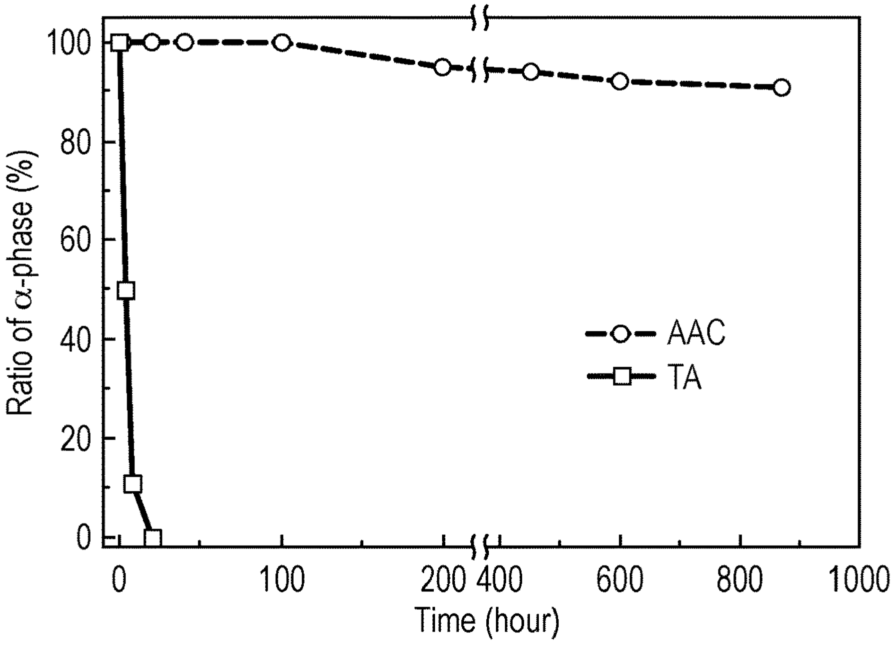
Figure 18A:
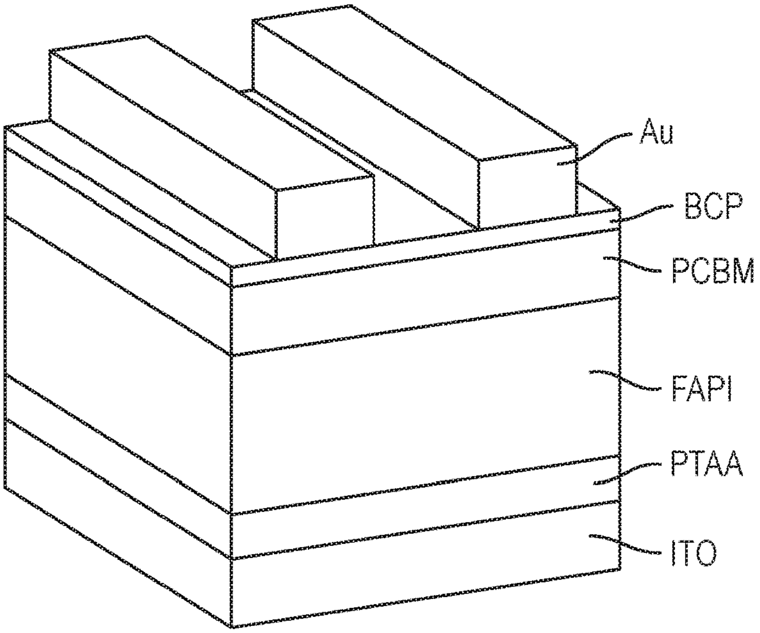
FIG. 18 shows photovoltaic device results for $FAPbI_3$ perovskite solar cells treated using thermal annealing (TA) at 150° C. and aerosol annealing for 1 min and 2.5 min.
Figure 18B:
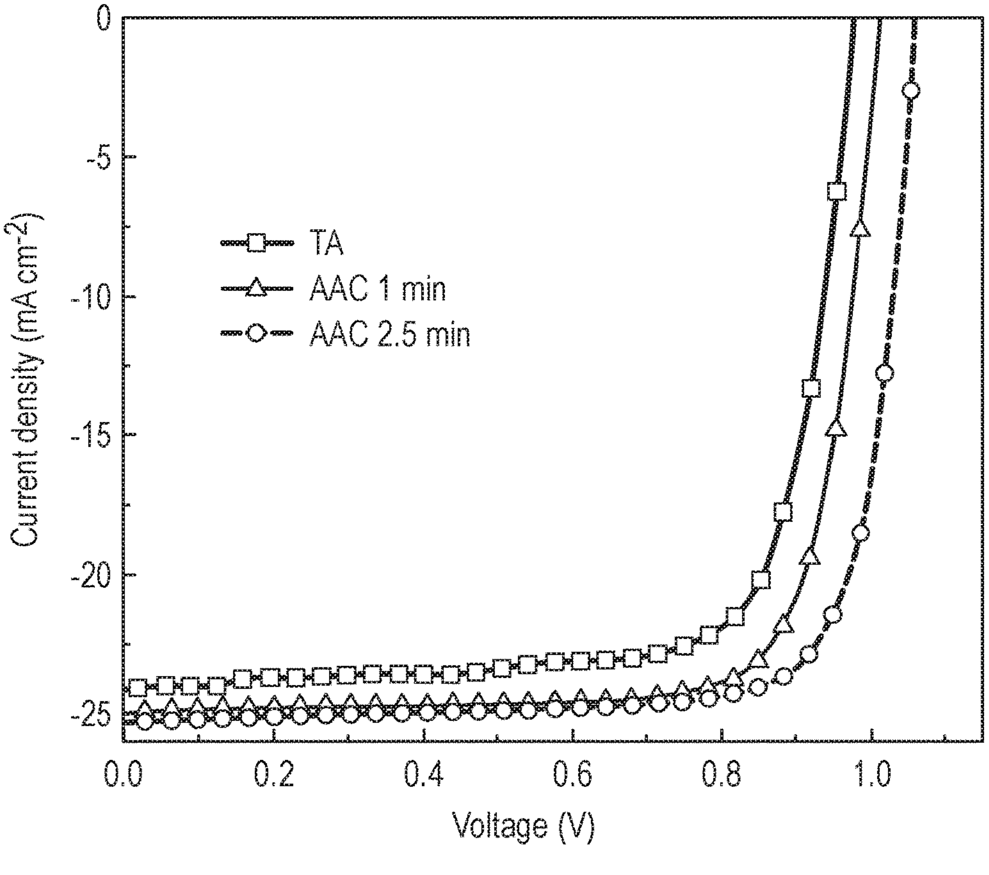
Figure 18C:
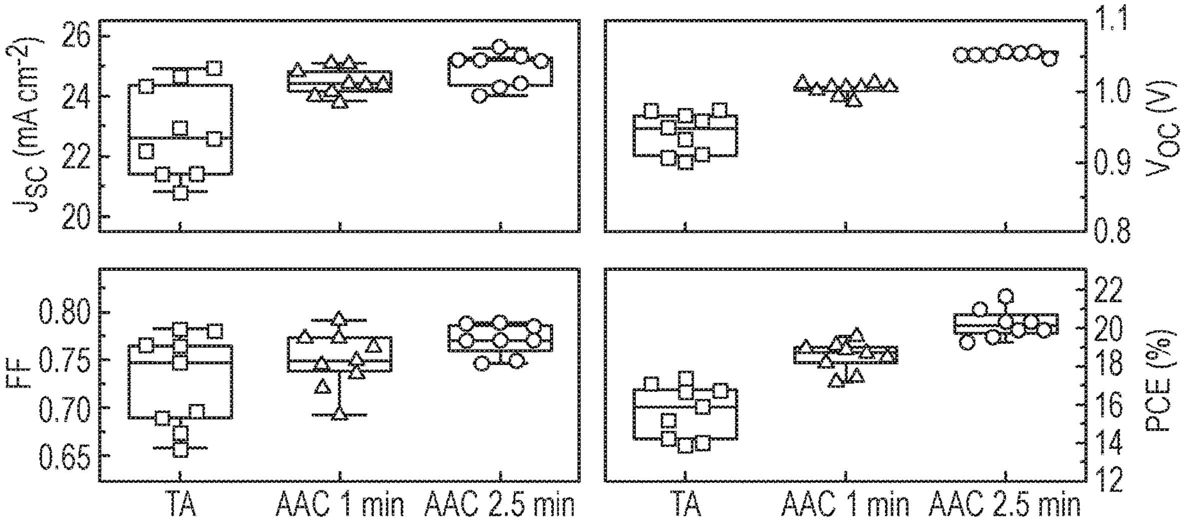
Figure 18D:
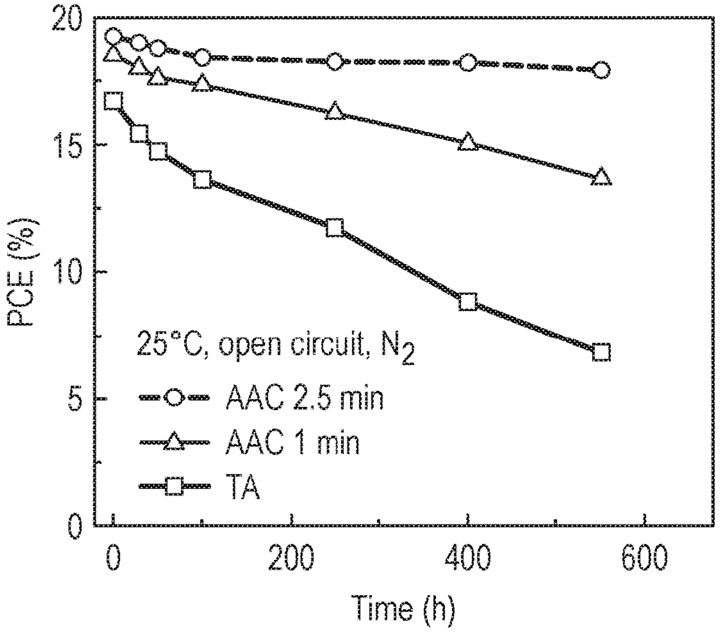

Improved stability of aerosol-annealing α-$FAPbI_3$ compared to thermally annealed when bare films are left in air in dark for up to 900 hours is demonstrated by the results shown in FIG. 17. This shows a) photographs of films left for up to 20 hours (TA=thermally annealed). b) ratio of phases as found from XRD analysis. For the first 100 hours aerosol treated film remains pure α-phase, where TA films revert to δ-phase fully after 20 hours.

FIG. 18 presents photovoltaic device results for $FAPbI_3$ perovskite solar cells treated using thermal annealing (TA) at 150° C. and aerosol annealing for 1 min and 2.5 min. In this figure, a) is the schematic of device configuration used for testing. PTAA=Poly[bis(4-phenyl)(2,5,6-trimethylphenyl)amine; PCBM=Phenyl-C61-butyric acid methyl ester; BCP=bathocuproin. b) Example photovoltaic performance of three device types. c) Statistical results for devices treated using three methods. d) Device stability results under continuous light soaking in $N_2$, with periodic testing, showing substantially higher stability for aerosol-treated device.

REFERENCES

[Ref 1] Min, J. et al. Gaining further insight into the effects of thermal annealing and solvent vapor annealing on time morphological development and degradation in small molecule solar cells. Journal of Materials Chemistry A (2017). doi:10.1039/c7ta04769j

[Ref 2] Dickey, K. C., Anthony, J. E. & Loo, Y.-L. Improving Organic Thin-Film Transistor Performance through Solvent-Vapor Annealing of Solution-Processable Triethylsilylethynyl Anthradithiophene. Advanced Materials 18, 1721-1726 (2006).

[Ref 3] Xiao, Z. et al. Solvent Annealing of Perovskite-Induced Crystal Growth for Photovoltaic-Device Efficiency Enhancement. Advanced Materials 26, 6503-6509 (2014).

[Ref 4] Tian, L. et al. Post-treatment of Perovskite Films toward Efficient Solar Cells via Mixed Solvent Annealing. ACS Applied Energy Materials 2, 4954-4963 (2019).

[Ref 5] Liu, J. et al. Improved Crystallization of Perovskite Films by Optimized Solvent Annealing for High Efficiency Solar Cell. ACS Applied Materials & Interfaces 7, 24008-24015 (2015).

[Ref 6] Xiong, H. et al. Solvent vapor annealing of oriented PbI2films for improved crystallization of perovskite films in the air. Solar Energy Materials and Solar Cells 166, 167-175 (2017).

[Ref 7] Zhang, F. et al. Film-through large perovskite grains formation: Via a combination of sequential thermal and solvent treatment. Journal of Materials Chemistry A 4, 8554-8561 (2016).

[Ref 8] Leolukman, M., La, Y. H., Li, X. & Gopalan, P. Morphology development in asymmetric poly (styrene-b-tert-butylacrylate) thin films by solvent annealing. Polymer Journal 40, 825-831 (2008).

[Ref 9] Engmann, S. et al. Film morphology evolution during solvent vapor annealing of highly efficient small molecule donor/acceptor blends. Journal of Materials Chemistry A 4, 15511-15521 (2016).

[Ref 10] Du, T. et al. Formation, location and beneficial role of PbI 2 in lead halide perovskite solar cells. Sustain. Energy Fuels 1, 119-126 (2017).

The invention claimed is:

1. A method of solvent annealing comprising:

exposing a perovskite layer to a laminar flow of a solvent aerosol, wherein the laminar flow produces a boundary layer between the laminar flow and the perovskite layer; and heating the perovskite layer to a predetermined temperature ranging from 50° C. to 200° C. during the exposing.

2. A method according to claim 1 wherein the exposing is performed for a period greater than 2 minutes.

3. A method according to claim 1 wherein the exposing is performed for a period less than 10 minutes.

4. A method according to claim 1 wherein the solvent is a polar solvent.

5. A method according to claim 4 wherein the solvent is selected from the group consisting of:

N,N-Dimethylformamide
Water
Methanol
Ethanol
Isopropanol
2-Methoxyethanol
Acetone
Acetonitrile
Ethyl acetate
Chlorobenzene
Dimethyl sulfoxide.

6. A method according to claim 1 wherein the perovskite layer is formed of a perovskite material with the formula $A^1_pA^2_qA^3_rB(X^1_sX^2_tX^3_u)_3$, in which:

$A^1$, $A^2$ and $A^3$ are each independently caesium, rubidium, a $C_{1-5}$alkylamine cation, a $C_{1-5}$alkyldiamine cation such as formamidinium, an imidazolium cation, or guanidinium;

p q and r are each independently 0 to 1, provided that p+q+r=1;

B is Pb or Sn;

$X^1$, $X^2$ and $X^3$ are each independently a halide or a pseudohalide; and r, s t and u are each independently 0 to 1, provided that s+t+u=1.

7. A method according to claim 6 wherein the perovskite layer is formed of a material selected from the group consisting of:

$CH_3NH_3PbI_3$
$Cs_{0.15}(HC(NH_2)_2)_{0.85}Pb(I_{0.95}Br_{0.05})_3$
$CH_3NH_3PbI_{0.82}Br_{0.12}$
$Cs_{0.15}(HC(NH_2)_2)_{0.85}Pb(I_{0.9}Br_{0.1})_3$
$Cs_{0.1}(HC(NH_2)_2)_{0.9}\ Pb(I_{0.95}Br_{0.05})_3$
$HC(NH_2)_2PbI_3$.

8. A method according to claim 1 wherein the perovskite layer is formed of α-phase $FAPbI_3$ or α-phase $FAPb(I_{3-x}Br_x)$ in which x is greater than zero and less than three.

9. A method according to claim 8 wherein the predetermined temperature ranges between 90° C. to 110° C.

10. A method according to claim 8 wherein the exposing is performed for a period of less than 10 minutes.

11. A method according to claim 1 wherein the solvent is aerosolised in a carrier gas.

12. A method according to claim 11 wherein the flow rate of the carrier gas is in the range of 0.1 l/min to 1.5 l/min during the exposing.

13. A method according to claim 1, further comprising doping the perovskite, wherein the aerosol further comprises one or more additional components for the doping of the perovskite.

14. A method according to claim 1 wherein the aerosol further comprises one or more passivation additives.

15. A method according to claim 1 wherein the aerosol further comprises components to form organic charge transport and/or contact layers, the components including one or more of: Phenyl-C61-butyric acid methyl ester, Bathocuproine, non-fullerene acceptors, poly(3,4-ethylenedioxythiophene) polystyrene sulfonate or poly(triaryl amine).

16. A method according to claim 1 wherein the aerosol further comprises one or more salts.

17. A device incorporating a perovskite layer treated by a solvent annealing method according to claim 1, wherein the device includes a photovoltaic cell, a light emitting diode, a photodetector or a detector of ionising radiation, wherein the method increases grain size while controlling surface roughness of the perovskite layer.

18. A method according to claim 11, wherein the carrier gas is $N_2$.

19. A method according to claim 16, wherein the one or more halide salts are selected from the group consisting of MACl, MAI, FAI, FABr, CsI.

20. The method according to claim 1, wherein the boundary layer is a stable boundary layer.

21. A method of solvent annealing comprising:

exposing a perovskite layer to a laminar flow of a solvent aerosol, wherein the laminar flow consists substantially of a laminar flow of the solvent aerosol; and heating the perovskite layer to a predetermined temperature ranging from 50° C. to 200° C. during the exposing.

* * * * *